(12) United States Patent
Joe

(10) Patent No.: US 12,159,675 B2
(45) Date of Patent: *Dec. 3, 2024

(54) NONVOLATILE MEMORY DEVICE INCLUDING A LOGIC CIRCUIT TO CONTROL WORD LINE VOLTAGES

(71) Applicant: SAMSUNG ELECTRONICS CO., LTD., Suwon-si (KR)

(72) Inventor: Sung-Min Joe, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/522,829

(22) Filed: Nov. 29, 2023

(65) Prior Publication Data

US 2024/0096420 A1 Mar. 21, 2024

Related U.S. Application Data

(63) Continuation of application No. 18/175,043, filed on Feb. 27, 2023, now Pat. No. 11,869,594, which is a
(Continued)

(30) Foreign Application Priority Data

Feb. 26, 2018 (KR) .................. 10-2018-0022968

(51) Int. Cl.
*G11C 16/04* (2006.01)
*G11C 16/08* (2006.01)
(Continued)

(52) U.S. Cl.
CPC .......... *G11C 16/08* (2013.01); *G11C 16/0483* (2013.01); *G11C 16/10* (2013.01);
(Continued)

(58) Field of Classification Search
CPC ..... G11C 16/3459; G11C 16/08; G11C 16/26; G11C 16/24; G11C 16/30; G11C 16/16;
(Continued)

(56) References Cited

U.S. PATENT DOCUMENTS 6,266,270 B1 7/2001 Nobukata
6,519,184 B2* 2/2003 Tanaka ............... G11C 16/344
365/185.24
(Continued)

FOREIGN PATENT DOCUMENTS

CN 102549673 7/2012
CN 103219040 7/2013
(Continued)

OTHER PUBLICATIONS

Ex Parte Quayle Office Action dated Jul. 30, 2021 in corresponding U.S. Appl. No. 16/941,045.
(Continued)

*Primary Examiner* — Tha-O H Bui
(74) *Attorney, Agent, or Firm* — F. Chau & Associates, LLC

(57) ABSTRACT

According to an exemplary embodiment of the inventive concept, there is provided a nonvolatile memory device comprising: a memory cell region including a first metal pad, a peripheral circuit region including a second metal pad and vertically connected to the memory cell region by the first metal pad and the second metal pad, a memory cell array, in the memory cell region, comprising a plurality of memory cells, a plurality of word lines and a bit line connected to the memory cells, wherein each memory cell is connected to one of the word lines, a voltage generator, in the peripheral circuit region, supplying a plurality of supply voltages to the memory cell array, a control logic circuit, in the peripheral circuit region, programming a selected one of
(Continued)

the memory cells connected to a selected one of the word lines into a first program state by controlling the voltage generator, and a verify circuit, in the peripheral circuit region, controlling a verify operation on the memory cell array by controlling the voltage generator, wherein the verify circuit controls a word line voltage applied to at least one unselected word line not to be programmed among the plurality of word lines in the verify operation and a bit line voltage applied to the bit line connected differently from a voltage level of a voltage applied in a read operation of the nonvolatile memory device.

17 Claims, 16 Drawing Sheets

Related U.S. Application Data continuation of application No. 17/552,116, filed on Dec. 15, 2021, now Pat. No. 11,605,432, which is a continuation of application No. 16/941,045, filed on Jul. 28, 2020, now Pat. No. 11,238,933, which is a continuation-in-part of application No. 16/257,985, filed on Jan. 25, 2019, now abandoned.

(51) Int. Cl.
| | | |
|---|---|---|
| *G11C 16/10* | (2006.01) | |
| *G11C 16/26* | (2006.01) | |
| *G11C 16/34* | (2006.01) | |
| *H01L 23/00* | (2006.01) | |
| *H01L 25/065* | (2023.01) | |
| *H01L 25/18* | (2023.01) | |
| *H10B 41/27* | (2023.01) | |
| *H10B 43/27* | (2023.01) | |

(52) U.S. Cl.
CPC .......... *G11C 16/26* (2013.01); *G11C 16/3459* (2013.01); *G11C 16/349* (2013.01); *H01L 24/16* (2013.01); *H01L 25/0657* (2013.01); *H01L 25/18* (2013.01); *H10B 41/27* (2023.02); *H10B 43/27* (2023.02); *H01L 2224/08145* (2013.01); *H01L 2924/1431* (2013.01); *H01L 2924/14511* (2013.01)

(58) Field of Classification Search
CPC ................. G11C 16/0483; G11C 7/04; G11C 2211/5644; G11C 16/3418; G11C 16/349; G11C 11/5671; G11C 8/08; G11C 2211/5621; G11C 2211/562; G11C 16/3481; G11C 16/10
USPC .................................................. 365/185.09
See application file for complete search history.

(56) References Cited

U.S. PATENT DOCUMENTS

| | | | |
|---|---|---|---|
| 7,310,272 B1 | 12/2007 | Mokhlesi et al. | |
| 7,369,437 B2 | 5/2008 | Kamei | |
| 7,599,224 B2 | 10/2009 | Lee | |
| 7,751,254 B2 | 7/2010 | Park et al. | |
| 7,773,427 B2 | 8/2010 | Park et al. | |
| 7,839,687 B2 | 11/2010 | Dutta et al. | |
| 7,911,846 B2 | 3/2011 | Hemink | |
| 8,295,095 B2 | 10/2012 | Jones | |
| 8,472,266 B2* | 6/2013 | Khandelwal | G11C 11/5628 365/189.15 |
| 8,599,622 B2* | 12/2013 | Kim | G11C 16/32 365/185.29 |
| 9,082,488 B2 | 7/2015 | Shim et al. | |
| 9,218,887 B2 | 12/2015 | Jung | |
| 9,257,185 B2 | 2/2016 | Park et al. | |
| 9,779,833 B2 | 10/2017 | Joo et al. | |
| 10,008,270 B2 | 6/2018 | Lee et al. | |
| 11,238,933 B2 | 2/2022 | Joe | |
| 11,605,432 B2 | 3/2023 | Joe | |
| 2005/0237829 A1 | 10/2005 | Nakamura et al. | |
| 2007/0291543 A1 | 12/2007 | Mokhlesi | |
| 2008/0253181 A1 | 10/2008 | Edahiro et al. | |
| 2009/0122616 A1 | 5/2009 | Jang et al. | |
| 2011/0032757 A1 | 2/2011 | Dutta et al. | |
| 2012/0163096 A1 | 6/2012 | Futatsuyama et al. | |
| 2017/0242632 A1 | 8/2017 | Cho | |
| 2019/0267107 A1 | 8/2019 | Joe | |
| 2020/0357469 A1 | 11/2020 | Joe | |
| 2022/0108749 A1 | 4/2022 | Joe et al. | |
| 2023/0215499 A1 | 7/2023 | Joe | |

FOREIGN PATENT DOCUMENTS

| | | |
|---|---|---|
| CN | 107068190 | 8/2017 |
| CN | 10739590 | 11/2017 |
| KR | 1020100138545 | 12/2010 |

OTHER PUBLICATIONS

Final Office Action Dated Jul. 14, 2020 in Related U.S. Appl. No. 16/257,985.
Notice Of Allowance dated Sep. 20, 2021 in corresponding U.S. Appl. No. 16/941,045.
Notice of Allowance dated Nov. 9, 2022 in corresponding U.S. Appl. No. 17/552,116.
Notice of Allowance issued Nov. 2, 2022 in corresponding KR Patent Application No. 10-2018-0022968.
Office Action dated Sep. 21, 2022 in corresponding U.S. Appl. No. 17/552,116.
Office Action Dated Feb. 18, 2020 in Related U.S. Appl. No. 16/257,985.
Notice of Allowance dated Aug. 29, 2023 in corresponding U.S. Appl. No. 18/175,043.
Office Action dated Jun. 29, 2023 in corresponding U.S. Appl. No. 18/175,043.
1st Office Action dated Jun. 24, 2024 in corresponding CN Patent Application No. 201910080067.3.

* cited by examiner

NONVOLATILE MEMORY DEVICE INCLUDING A LOGIC CIRCUIT TO CONTROL WORD LINE VOLTAGES

CROSS-REFERENCE TO RELATED APPLICATION

This application is a continuation of U.S. patent application Ser. No. 18/175,043 filed Feb. 27, 2023, which is a continuation of U.S. patent application Ser. No. 17/552,116 filed Dec. 15, 2021, issued as U.S. Pat. No. 11,605,432 on Mar. 14, 2023, which is a continuation application of U.S. patent application Ser. No. 16/941,045 filed Jul. 28, 2020, issued as U.S. Pat. No. 11,238,933 on Feb. 1, 2022, which is a continuation-in-part application of U.S. patent application Ser. No. 16/257,985 filed Jan. 25, 2019, which claims the benefit of priority under 35 U.S.C. § 119 to Korean Patent Application No. 10-2018-0022968, filed on Feb. 26, 2018, in the Korean Intellectual Property Office, the disclosures of which are incorporated by reference in their entirety herein.

BACKGROUND

1. Technical Field

The inventive concept relates to a memory device, and more particularly, to a nonvolatile memory device that performs a program operation including a verify operation.

2. Discussion of Related Art

Semiconductor memory devices are memory devices that are implemented by using a semiconductor such as silicon (Si), germanium (Ge), gallium arsenide (GaAs), or indium phosphide (InP). The semiconductor memory devices may be classified into volatile memory devices and nonvolatile memory devices.

The nonvolatile memory devices retain data stored therein even when power supply thereto is interrupted. Examples of the nonvolatile memory devices include read-only memory (ROM) devices, programmable read-only memory (PROM) devices, erasable programmable read-only memory (EPROM) devices, electrically erasable programmable read-only memory (EEPROM) devices, flash memory devices, phase-change random-access memory (PRAM) devices, magnetic random-access memory (MRAM) devices, resistive random-access memory (RRAM) devices, and ferroelectric random-access memory (FRAM) devices. The flash memory devices may be classified into NOR-type flash memory devices and NAND-type flash memory devices.

A program operation is used to program data to a target memory cell of a memory device such as the above-described non-semiconductor memory device. A verify operation is used to verify that the target memory cell was properly programmed by the program operation.

SUMMARY

The inventive concept provides a nonvolatile memory device and a method of operating the same, which may improve a retention characteristic by taking into account a program state of an adjacent word line in a verify operation.

According to an exemplary embodiment of the inventive concept, there is provided a nonvolatile memory device comprising: a memory cell region including a first metal pad, a peripheral circuit region including a second metal pad and vertically connected to the memory cell region by the first metal pad and the second metal pad, a memory cell array, in the memory cell region, comprising a plurality of memory cells, a plurality of word lines and a bit line connected to the memory cells, wherein each memory cell is connected to one of the word lines, a voltage generator, in the peripheral circuit region, supplying a plurality of supply voltages to the memory cell array, a control logic circuit, in the peripheral circuit region, programming a selected one of the memory cells connected to a selected one of the word lines into a first program state by controlling the voltage generator, and a verify circuit, in the peripheral circuit region, controlling a verify operation on the memory cell array by controlling the voltage generator, wherein the verify circuit controls a word line voltage applied to at least one unselected word line not to be programmed among the plurality of word lines in the verify operation and a bit line voltage applied to the bit line connected differently from a voltage level of a voltage applied in a read operation of the nonvolatile memory device.

According to an exemplary embodiment of the inventive concept, there is provided a nonvolatile memory device including: a memory cell array including a plurality of memory cells, a plurality of word lines and a bit line connected to the memory cells, where each memory cell is connected to one of the word lines; a voltage generator supplying a plurality of supply voltages to the memory cell array; a control logic circuit programming a selected one of the memory cells connected to a selected one of the word lines into a first program state by controlling the voltage generator; and a verify circuit controlling a verify operation on the memory cell array by controlling the voltage generator. The verify circuit controls a word line voltage applied to at least one unselected word line not to be programmed among the plurality of word lines in the verify operation and a bit line voltage applied to the bit line differently from a voltage level of a voltage applied in a read operation.

According to an exemplary embodiment of the inventive concept, there is provided a nonvolatile memory system including a memory controller and a nonvolatile memory device. The nonvolatile memory system includes: a memory controller outputting a command and an address to the nonvolatile memory device to access data in the nonvolatile memory device; and a nonvolatile memory device storing the data based on control of the memory controller. The nonvolatile memory device includes: a memory cell array including a plurality of memory cells, a plurality of word lines and a bit line connected to the memory cells, where each memory cell is connected to one of the word lines; a voltage generator supplying a plurality of voltages to the memory cell array; a control logic circuit programming a selected one of the memory cells into a first program state by controlling the voltage generator in response to a program command of the memory controller; and a verify circuit controlling performance of a verify operation on the memory cell array by controlling the voltage generator in response to the program command, wherein the verify circuit controls a word line voltage applied to at least one unselected word line not to be programmed among the plurality of word lines in the verify operation and a bit line voltage applied to the bit line differently from a voltage applied in a read operation of the nonvolatile memory device.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
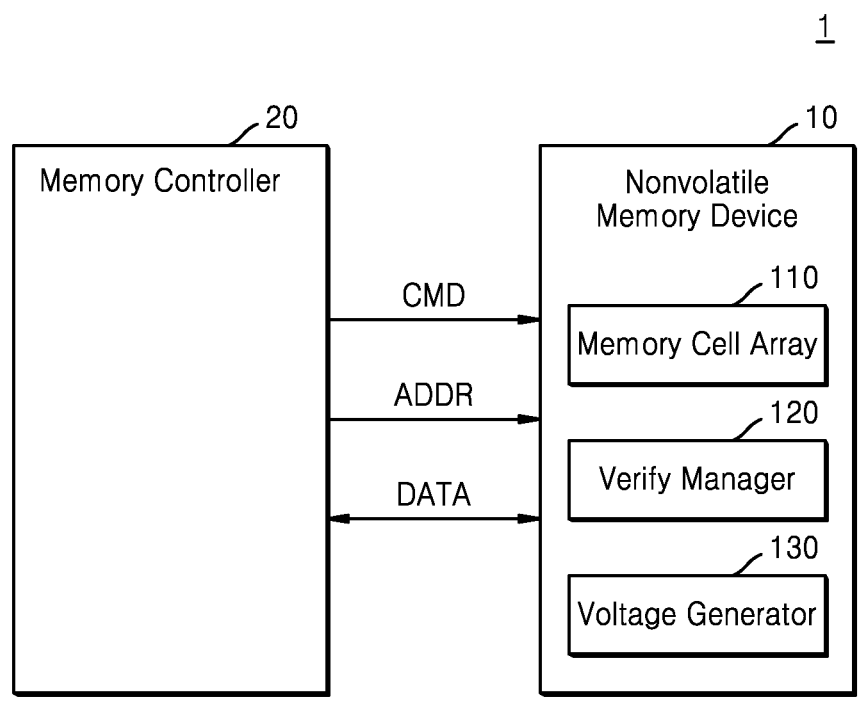
FIG. 1 is a block diagram illustrating a nonvolatile memory system according to an exemplary embodiment the inventive concept.

FIG. 1 is a block diagram illustrating a nonvolatile memory system according to an exemplary embodiment of the inventive concept.

Referring to FIG. 1, a nonvolatile memory system 1 may be implemented as one of a plurality of computing systems such as a workstation, a netbook, a personal digital assistant (PDA), a portable computer, a web tablet, a wireless phone, a mobile phone, a smart phone, an e-book, a portable multimedia player (PMP), a portable game device, a navigation device, a black box, a digital camera, a digital multimedia broadcasting (DMB) player, a digital audio recorder, a digital audio player, a digital picture recorder, a digital picture player, a digital video recorder, and a digital video player.

The nonvolatile memory system 1 includes a memory controller 20 and a nonvolatile memory device 10. As an example, each of a host, the memory controller 20, and the nonvolatile memory device 10 may be provided as a chip, a package, or a module. Alternatively, the memory controller 20 and the nonvolatile memory device 10 may be mounted and provided by using packages such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline (TSOP), System In Package (SIP), Multi Chip Package (MCP), Wafer-level Fabricated Package (WFP), and Wafer-level Processed Stack Package (WSP).

The memory controller 20 may control the nonvolatile memory device 10 in response to a program request or a read request received from a host (not illustrated). For example, the memory controller 20 may transmit a program command CMD and an address ADDR to the nonvolatile memory device 10 in response to the program request received from the host. The address ADDR transmitted by the memory controller 20 to the nonvolatile memory device 10 may be a physical address of the nonvolatile memory device 10. For example, the address ADDR may include a certain location within the nonvolatile memory device 10. The memory controller 20 may exchange data (DATA) with the nonvolatile memory device 10.

The nonvolatile memory device 10 may perform operations, such as programming, reading, and erasing, in response to signals received from the memory controller 20. In an exemplary embodiment, when the nonvolatile memory device 10 programs the memory cells, a program voltage and a verify voltage is provided to a word line according to an incremental step pulse programming (ISPP) method. In an ISPP-based program operation, application of a program pulse and application of verify pulses are performed in one program loop. Selected memory cells may be programmed into a target state through a plurality of program loops. In an exemplary embodiment, a program operation causes the nonvolatile memory device 10 to apply a program voltage one or more times to a selected memory cell in a program loop. In an exemplary embodiment, a verify operation causes the nonvolatile memory device 10 to apply a verify voltage to a selected memory cell one or more times in a program loop. A program operation performed on a word line may refer to a program operation performed on a memory cell connected to the word line. A read operation performed on a word line may refer to a read operation performed on a memory cell connected to the word line.

The nonvolatile memory device 10 includes a memory cell array 110, a verify manager 120 (e.g., a circuit), and a voltage generator 130. The memory cell array 110 includes a plurality of memory cells. For example, the plurality of memory cells may be flash memory cells. Hereinafter, embodiments will be described in detail with respect to an embodiment where the plurality of memory cells are NAND flash memory cells. However, the inventive concept is not limited thereto. For example, the plurality of memory cells may be resistive memory cells such as resistive RAM (ReRAM), phase change RAM (PRAM), or magnetic RAM (MRAM).

The memory cell array 110 may be a three-dimensional (3D) memory cell array. The 3D memory cell array may include memory cell arrays monolithically formed on at least one physical level, which include an active region arranged on a silicon substrate and a circuit formed on or in the silicon substrate as a circuit related to an operation of memory cells. The term "monolithic" may mean that layers of each level constituting the array are stacked directly above layers of each lower level in the array. The 3D memory cell array may include NAND strings arranged in a vertical direction such that at least one memory cell is located on another memory cell. The at least one memory cell may include a charge trap layer. However, the inventive concept is not limited thereto. For example, and in another embodiment, the memory cell array 110 has a two-dimensional (2D) memory cell array.

U.S. Pat. Nos. 7,679,133, 8,553,466, 8,654,587, 8,559,235, and U.S. Patent Application Publication No. 2011/0233648 disclose the configurations of a 3D memory array in which a plurality of levels and word lines and/or bit lines are shared between the levels, the disclosures of which are incorporated herein by reference. Also, the disclosures of U.S. Patent Application Publication No. 2014/0334232 and U.S. Pat. No. 8,488,381 are incorporated herein by reference.

In an exemplary embodiment of the inventive concept, each memory cell included in the memory cell array 110 is a multi level cell (MLC) storing two or more bits of data. For example, the memory cell may be an MLC storing 2-bit data. As another example, the memory cell may be a triple level cell (TLC) storing 3-bit data or a quadruple level cell (QLC) storing 4-bit data. However, the inventive concept is not limited thereto. In another embodiment, some memory cells included in the memory cell array 110 are single level cells (SLCs) storing 1-bit data and some other memory cells thereof are MLCs.

The memory cell array 110 may be connected to a plurality of word lines and a plurality of bit lines, and may perform a program operation on a selected memory cell to be programmed by using one or more of the plurality of word lines and one or more of the plurality of bit lines. Hereinafter, a word line connected to a selected memory cell to be programmed among a plurality of word lines will be referred to as a selected word line, and a word line located adjacent to the selected word line (e.g., a word line located directly below or above the selected word line) will be referred to as an adjacent word line.

In an embodiment where the memory cells included in the memory cell array 110 are MLCs, the adjacent word line may be programmed into any one of an erase state E, a first program state P1, a second program state P2, and a third program state P3 in ascending order of threshold voltage. A threshold voltage difference between the selected memory cell and the memory cell connected to the adjacent word line may vary between the case where the adjacent word line is programmed into a state of a relatively low threshold voltage (e.g., the erase state E or the first program state P1) and the case where the adjacent word line is programmed into a state of a relatively high threshold voltage (e.g., the second program state P2 or the third program state P3). Accordingly, a distribution of the memory cell connected to the selected word line may vary according to the program state of the adjacent word line after the retention due to the threshold voltage difference.

The nonvolatile memory device 10 according to the inventive concept may improve the distribution of the selected memory cell by considering the program state of the adjacent word line without performing a separate read operation in a verify operation on the selected memory cell.

Hereinafter, the case of being programmed into a state of a relatively low threshold voltage (e.g., the erase state E or the first program state P1) will be referred to as a low-level program state and the case of being programmed into a state of a relatively high threshold voltage (e.g., the second program state P2 or the third program state P3) will be referred to as a high-level program state. It will be understood that the above is merely an example, as the criterion for dividing the low-level program state and the high-level program state may be variously set.

The verify manager 120 (e.g., a verify circuit) controls voltage levels of various voltages necessary for a verify operation by controlling the voltage generator 130. In an embodiment, the verify manager 120 performs a control operation such that a voltage applied to the adjacent word line in a verify operation (hereinafter referred to as an adjacent word line voltage) is lower than a voltage applied to the adjacent word line in a read operation (hereinafter referred to as a read word line voltage). In an embodiment, the verify manager 120 performs a control operation such that a voltage applied to the bit line in a verify operation (hereinafter referred to as a bit line voltage) is higher than a bit line sensing voltage applied to the bit line in a read operation. Accordingly, the cell distribution of the selected memory cell may be determined differently according to the program state of the memory cell connected to the adjacent word line, and the distribution of the selected memory cell may be improved after the retention.

In an embodiment, the verify manager 120 controls the adjacent word line voltage differently according to the position of the adjacent word line. In an embodiment, the verify manager 120 determines the adjacent word line voltage or the bit line voltage based on the voltage level of a verify voltage applied to the selected word line. In an embodiment, the verify manager 120 determines the adjacent word line voltage or the bit line voltage based on temperature information. In an embodiment, the verify manager 120 determines the adjacent word line voltage or the bit line voltage based on the program-erase cycle count of the memory cell array 110.

The voltage generator 130 may include at least one charge pump (not illustrated) and may provide various verify voltages to a plurality of word lines and bit lines based on a control signal of the verify manager 120.

Although this specification illustrates an operation of the nonvolatile memory device 10 in a case where the memory cell is an MLC, the inventive concept is not limited thereto. For example, embodiments of the inventive concept may be similarly applied to cases where the memory cell is an SLC or a QLC.

Figure 2:
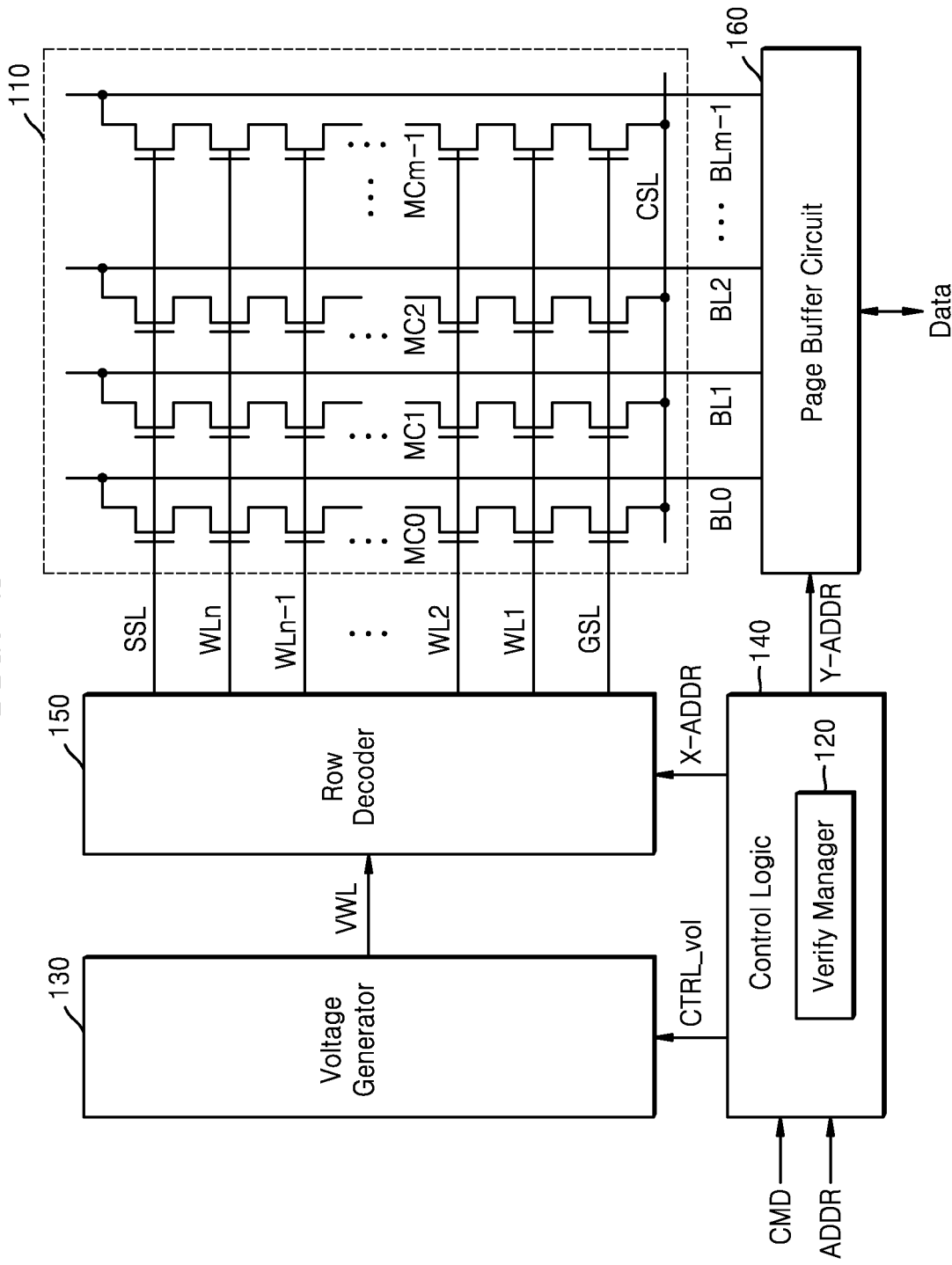
FIG. 2 is a block diagram illustrating a nonvolatile memory device according to an exemplary embodiment the inventive concept.

FIG. 2 is a block diagram illustrating a nonvolatile memory device according to an exemplary embodiment of the inventive concept. Redundant descriptions already given with reference to FIG. 1 will be omitted for conciseness.

Referring to FIG. 2, a nonvolatile memory device 10 includes a memory cell array 110, a voltage generator 130, a control logic 140 (e.g., a logic circuit), a row decoder 150 (e.g., a row decoding circuit), and a page buffer circuit 160, and the control logic 140 may include a verify manager 120. As an example, the nonvolatile memory device 10 is illustrated as being a flash memory device. However, the inventive concept is not limited to a flash memory device and may be applied to various types of nonvolatile memory devices, such as ROMs, PROMs, EEPROMs, flash memories, PRAMs, MRAMs, RRAMs, and FRAMs.

The memory cell array 110 is connected to the row decoder 150 through word lines WL1 to WLn, a string selection line SSL, and a ground selection line GSL. The memory cell array 110 is connected to the page buffer circuit 160 through bit lines BL0 to BLm−1. The memory cell array 110 includes a plurality of NAND cell strings. Each of the cell strings is connected to a plurality of bit lines BL0 to BLm−1 through a string selection transistor SST. The memory cell array 110 may include planes including a plurality of memory blocks, and the plurality of memory blocks may include a plurality of pages. The plurality of pages may include a plurality of memory cells. The memory cell array 110 will be described in more detail with reference to FIGS. 3 to 5.

The control logic 140 may control various operations in the nonvolatile memory device based on a command and an address ADDR received from the memory controller 20. For example, the control logic 140 may output a voltage control signal CTRL_vol to the voltage generator 130 to perform a program operation and a verify operation in response to a program command CMD. In an embodiment, based on the address ADDR, the control logic 140 outputs a column address Y-ADDR to the page buffer circuit 160 and outputs a row address X-ADDR to the row decoder 150 to designate a selected memory cell. For example, the column address Y-ADDR may identify one of the bit lines (e.g., BL0) and the row address X-ADDR may identify one of the word lines (e.g., WL1).

The row decoder 150 may select any one of the memory blocks of the memory cell array 110 in response to the row address X-ADDR. The row decoder 150 may select a word line among a plurality of word lines of the selected memory block. The row decoder 150 may transmit a word line voltage VWL (e.g., a program voltage, a verify voltage, or a pass voltage) from the voltage generator 130 to a word line of the selected memory block.

The page buffer circuit 160 may operate as a write driver (e.g. for writing data) or as a sense amplifier (e.g., for reading data) according to an operation mode. In a write operation, the page buffer circuit 160 transmits a bit line voltage corresponding to the data to be written to a bit line of the memory cell array 110. In a read operation, the page buffer circuit 160 senses the data stored in a selected memory cell through a bit line connected to a sensing node under the control of a bit line sensing signal. The page buffer circuit 160 may latch the sensed data and output the same to the outside.

Figure 3:
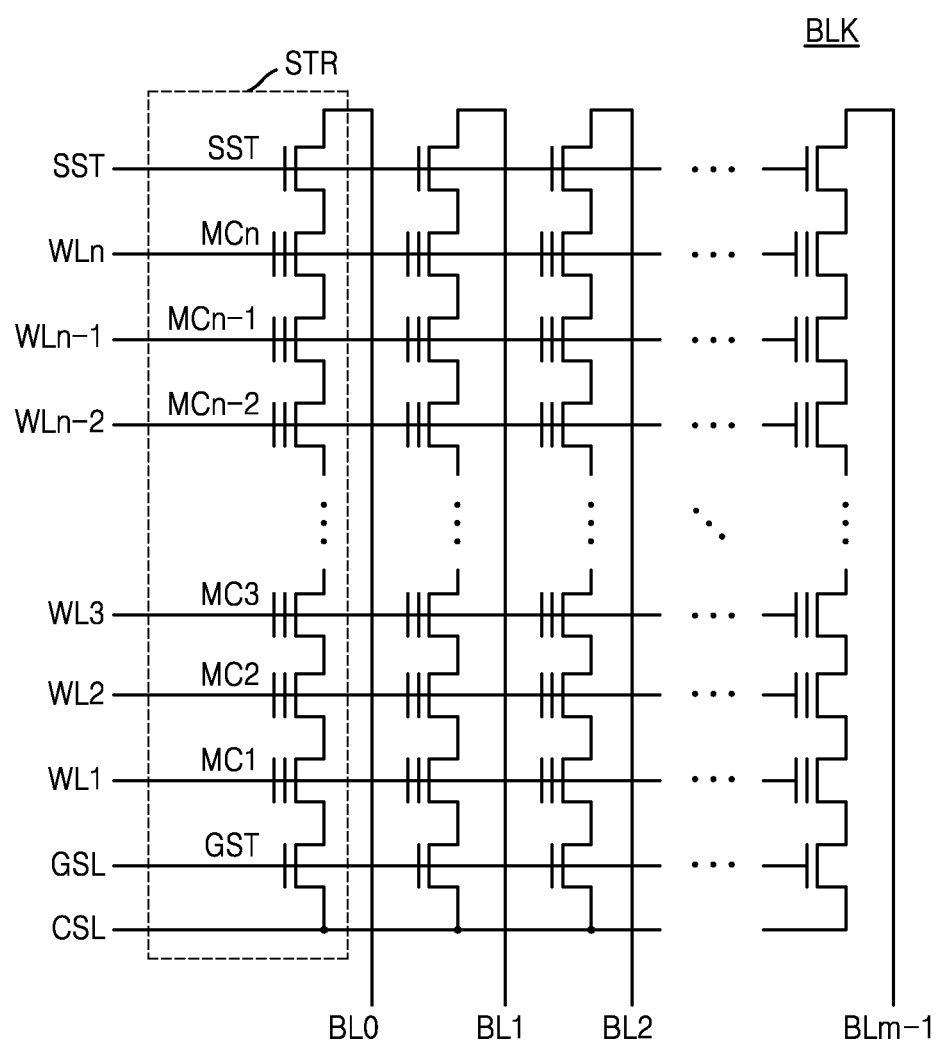
FIG. 3 is a circuit diagram illustrating a memory block included in a memory cell array according to an exemplary embodiment the inventive concept.

FIG. 3 is a circuit diagram illustrating a memory block included in a memory cell array according to an exemplary embodiment of the inventive concept.

Referring to FIG. 3, a memory cell array (e.g., 110 of FIG. 2) may be a memory cell array of a horizontal NAND flash memory and may include a plurality of memory blocks. Each memory block BLK may include m (m is an integer greater than or equal to 2) cell strings STR in which a plurality of memory cells MC are connected in series in the direction of bit lines BL0 to BLm−1. FIG. 3 illustrates an example in which each cell string STR includes n memory cells.

A NAND flash memory device having the structure as illustrated in FIG. 3 may perform an erase operation in units of blocks and perform a program operation in units of pages corresponding to word lines WL1 to WLn. FIG. 3 illustrates an example in which n pages for n word lines WL1 to WLn are provided in one block. The nonvolatile memory device 10 may drive a selected word line connected to a memory cell to be programmed in a program operation and a verify operation. In an example, when a program operation is performed on a third memory cell MC3, a third word line WL3 is a selected word line. In this example, an adjacent word line is a second word line WL2 or a fourth word line WL4. The nonvolatile memory device 10 of FIGS. 1 and 2 may include a plurality of memory cell arrays performing the same operation with the same structure as the memory cell array 110 described above.

Figure 4:
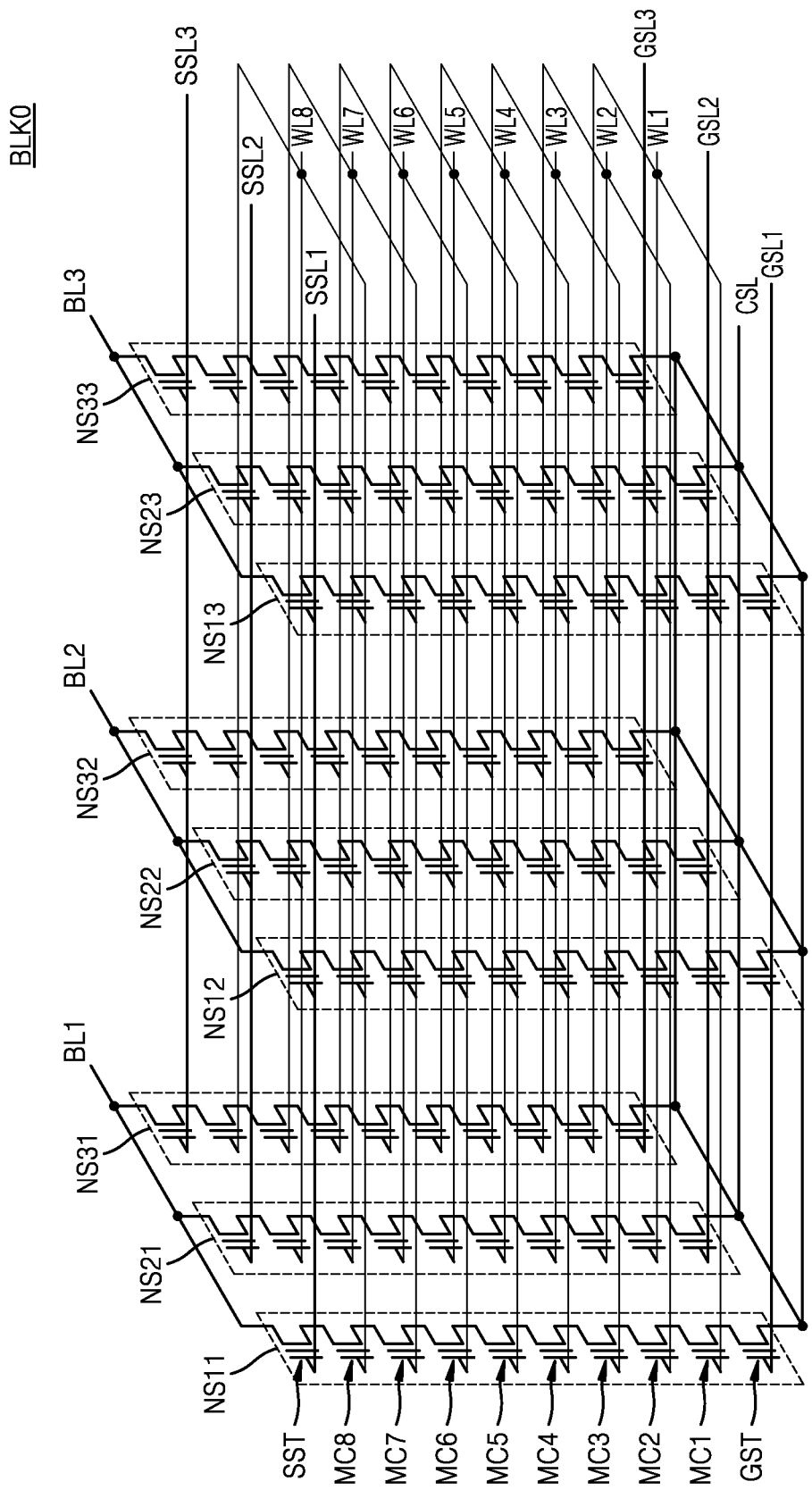
FIG. 4 is a circuit diagram illustrating another example of a memory block included in a memory cell array according to an exemplary embodiment the inventive concept.

FIG. 4 is a circuit diagram illustrating another example of a memory block included in a memory cell array according to exemplary embodiment of the inventive concept.

Referring to FIG. 4, a memory cell array (e.g., 110 of FIG. 2) may be a memory cell array of a vertical NAND flash memory and may include a plurality of memory blocks. Each memory block BLK0 may include a plurality of NAND cell strings NS11 to NS33, a plurality of word lines WL1 to WL8, a plurality of bit lines BL1 to BL3, a plurality of ground selection lines GSL1 to GSL3, a plurality of cell string selection lines SSL1 to SSL3, and a common source line CSL. Herein, the number of NAND cell strings, the number of word lines, the number of bit lines, the number of ground selection lines, and the number of cell string selection lines may vary according to embodiments.

NAND cell strings NS11, NS21, and NS31 may be provided between the first bit line BL1 and the common source line CSL, NAND cell strings NS12, NS22, and NS32 may be provided between the second bit line BL2 and the common source line CSL, and NAND cell strings NS13, NS23, and NS33 may be provided between the third bit line BL3 and the common source line CSL. Each NAND cell string (e.g., NS11) may include a cell string selection transistor SST, a plurality of memory cells MC1 to MC8, and a ground selection transistor GST that are connected in series.

Cell strings connected in common to one bit line may constitute one column. For example, the cell strings NS11, NS21, and NS31 connected in common to the first bit line BL1 may correspond to the first column, the cell strings NS12, NS22, and NS32 connected in common to the second bit line BL2 may correspond to the second column, and the cell strings NS13, NS23, and NS33 connected in common to the third bit line BL3 may correspond to the third column.

Cell strings connected to one cell string selection line may constitute one row. For example, the cell strings NS11, NS12, and NS13 connected to the first cell string selection line SSL1 may correspond to the first row, the cell strings NS21, NS22, and NS23 connected to the second cell string selection line SSL2 may correspond to the second row, and the cell strings NS31, NS32, and NS33 connected to the third cell string selection line SSL3 may correspond to the third row.

The cell string selection transistor SST may be connected to the corresponding cell string selection lines SSL1 to SSL3. The plurality of memory cells MC1 to MC8 may be connected to the corresponding word lines WL1 to WL8, respectively. The ground selection transistor GST may be connected to the corresponding ground selection lines GSL1 to GSL3. The cell string selection transistor SST may be connected to the corresponding bit lines BL1 to BL3, and the ground selection transistor GST may be connected to the common source line CSL.

The word lines (e.g., WL1) of the same height may be connected in common to each other, the cell string selection lines SSL1 to SSL3 may be separated from each other, and the ground selection lines GSL1 to GSL3 may also be separated from each other. For example, when the memory cells connected to the first word line WL1 and belonging to the cell strings NS11, NS12, and NS13 are programmed, the first word line WL1 and the first cell string selection line SSL1 may be selected. The ground selection lines GSL1 to GSL3 may be connected in common to each other.

Figure 5:
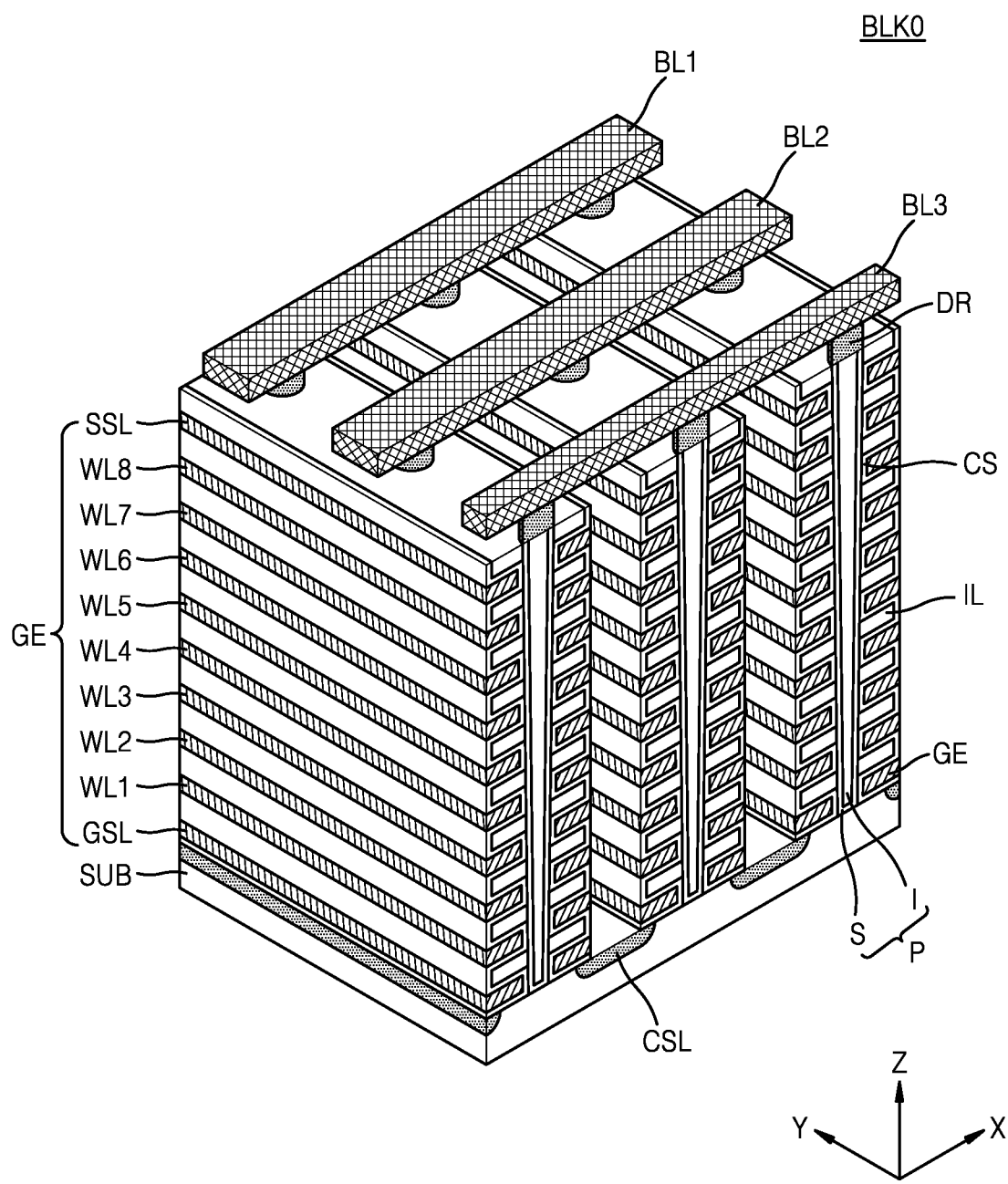
FIG. 5 is a perspective view illustrating the memory block of FIG. 4.

FIG. 5 is a perspective view illustrating the memory block of FIG. 4.

Referring to FIG. 5, each memory block included in a memory cell array (e.g., 110 of FIG. 2) may be formed in a direction perpendicular to a substrate SUB. Although FIG. 5 illustrates that the memory block includes two selection lines GSL and SSL, eight word lines WL1 to WL8, and three bit lines BL1 to BL3, the numbers of lines may be variously modified.

The substrate SUB may have a first conductivity type (e.g., p type), and a common source line CSL extending in a first direction (e.g., Y direction) and doped with a dopant of a second conductivity type (e.g., n type) may be provided on the substrate SUB. On a region of the substrate SUB between two adjacent common source lines CSL, a plurality of insulating layers IL extending in the first direction may be provided sequentially in a third direction (e.g., Z direction). The plurality of insulating layers IL may be spaced apart from each other by a certain distance in the third direction. For example, the plurality of insulating layers IL may include an insulating material such as a silicon oxide.

On a region of the substrate SUB between two adjacent common source lines CSL, a plurality of pillars P may be provided to be arranged sequentially in the first direction and penetrate the plurality of insulating layers IL in the third direction. For example, the plurality of pillars P may penetrate the plurality of insulating layers IL to contact the substrate SUB. In particular, a surface layer S of each pillar P may include a silicon material of a first conductivity type and may function as a channel region. Meanwhile, an inner layer I of each pillar P may include an insulating material such as a silicon oxide, or an air gap.

In a region between two adjacent common source lines CSL, a charge storage layer CS may be provided along the exposed surfaces of the insulating layers IL, the pillars P, and the substrate SUB. The charge storage layer CS may include a gate insulating layer (or a tunneling insulating layer), a charge trap layer, and a blocking insulting layer. For example, the charge storage layer CS may have an oxide-nitride-oxide (ONO) structure. Also, in a region between two adjacent common source lines CSL, on the exposed surface of the charge storage layer CS, a gate electrode GE including the selection lines GSL and SSL and the word lines WL1 to WL8 may be provided.

Drains or drain contacts DR may be provided respectively on the plurality of pillars P. For example, the drains or drain contacts DR may include a silicon material doped with a dopant of a second conductivity type. On the drains DR, the bit lines BL1 to BL3 may be provided to extend in a second direction (e.g., X direction) and be spaced apart from each other by a certain distance in the first direction.

Figure 6:
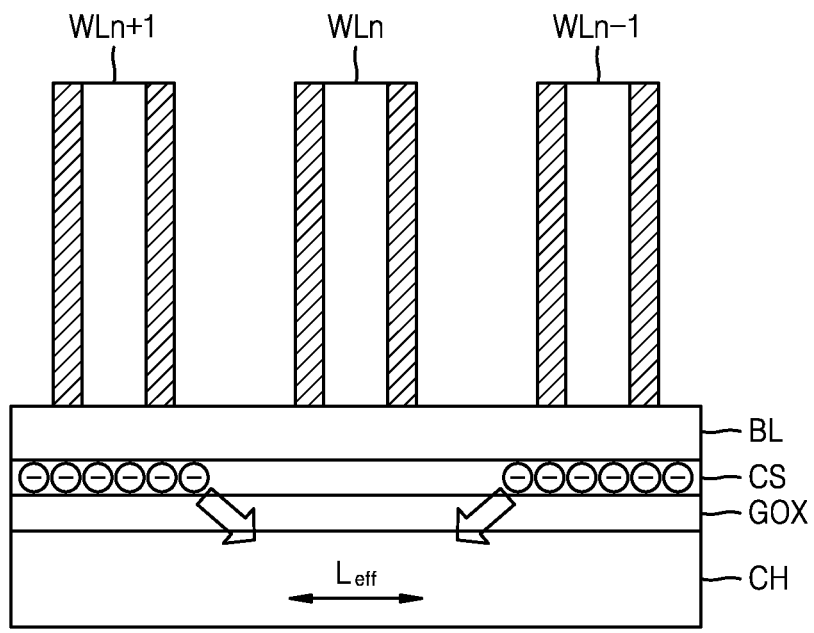
FIG. 6 is a diagram illustrating a portion of a memory cell array according to an exemplary embodiment the inventive concept.

FIG. 6 is a diagram illustrating a portion of a memory cell array according to an exemplary embodiment of the inventive concept.

Referring to FIG. 6, a memory cell array 110 includes a selected word line WLn and adjacent word lines WLn−1 and WLn+1 located adjacent to the selected word line WLn. The selected word line WLn and the adjacent word lines WLn−1 and WLn+1 may share a charge storage layer CS, a gate insulating layer GOX, and a channel CH through a blocking insulating layer BL.

According to an exemplary embodiment of the inventive concept, an adjacent word line voltage applied to adjacent word lines WLn−1 and WLn+1 during a verify operation has a lower voltage level than a read word line voltage applied to the adjacent word lines WLn−1 and WLn+1 during a read operation, and the charge of the charge storage layer CS corresponding to the adjacent word lines WLn−1 and WLn+1 may influence the selected word line WLn as the bias voltage level of the adjacent word lines WLn−1 and WLn+1 decreases. As a result, the charge of the charge storage layer CS corresponding to the adjacent word lines WLn−1 and WLn+1 may influence an effective channel length $L_{\it eff}$ of the selected word line WLn, and the distribution of a selected memory cell connected to the selected word line WLn may vary according to the program state of an adjacent memory cell connected to the adjacent word lines WLn−1 and WLn+1.

In an embodiment, when the program state of the adjacent memory cell is a high-level program state (e.g., the third program state P3), the charge amount of the charge storage layer CS corresponding to the adjacent word lines WLn−1 and WLn+1 is large and the effective channel length $L_{\it eff}$ of the selected memory cell increases due to the influence thereon. As a result, the threshold voltage of the selected memory cell may be relatively high.

In another embodiment, when the program state of the adjacent memory cell is a low-level program state (e.g., the erase state E), the charge amount of the charge storage layer CS corresponding to the adjacent word lines WLn−1 and WLn+1 is small and the effective channel length $L_{\it eff}$ of the selected memory cell decreases due to the influence thereon. As a result, the threshold voltage of the selected memory cell may be relatively low.

Figure 7:
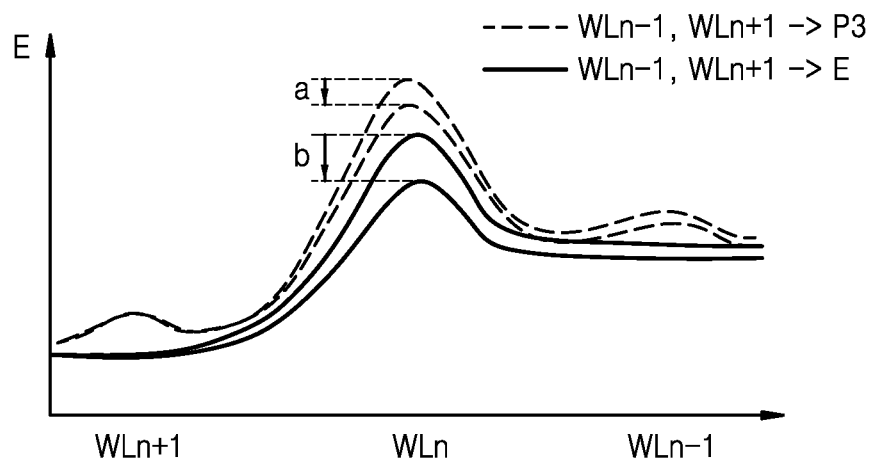
FIG. 7 is a graph illustrating an energy level of each word line according to an exemplary embodiment the inventive concept.

FIG. 7 is a graph illustrating an energy level of each word line according to an exemplary embodiment of the inventive concept. In the graph, the x axis represents a position of each word line and the y axis represents an energy level. Also, a broken line represents a graph where an energy level of a word line drops as a bit line voltage is determined as a high voltage level when the adjacent word lines WLn−1 and WLn+1 are in a high-level program state (e.g., the third program state P3), and a solid line represents a graph where an energy level of a word line drops as a bit line voltage is determined as a high voltage level when the adjacent word lines WLn−1 and WLn+1 are in a low-level program state (e.g., the erase state E).

Referring to FIG. 7, the energy level of the selected word line WLn is higher when the adjacent word lines WLn−1 and WLn+1 are in the high-level program state P3 than when the adjacent word lines WLn−1 and WLn+1 are in the low-level program state E.

According to an exemplary embodiment of the inventive concept, the bit line voltage applied to the bit line has a higher voltage level than the bit line sensing voltage applied to the bit line in the read operation, and a drain induced barrier lowering (DIBL) effect where the influence of the adjacent memory cell on the selected memory cell described above with reference to FIG. 6 increases, increases as the voltage level of the bit line voltage increases. That is, the DIBL effect may be greater when the adjacent word lines WLn−1 and WLn+1 are in the low-level program state E than when the adjacent word lines WLn−1 and WLn+1 are in the high-level program state P3.

As illustrated in FIG. 7, when the bit line voltage has a higher voltage level than the bit line sensing voltage, a first energy drop level "b" of dropping in the low-level program state E is greater than a second energy drop level "a" of dropping in the high-level program state P3. As a result, the threshold voltage of the memory cell connected to the selected word line WLn drops more and the threshold voltage difference is greater when the adjacent word lines WLn−1 and WLn+1 are in the low-level program state E than when the adjacent word lines WLn−1 and WLn+1 are in the high-level program state P3. Accordingly, the distribution of the selected memory cell may be improved after the retention.

Figure 8A:
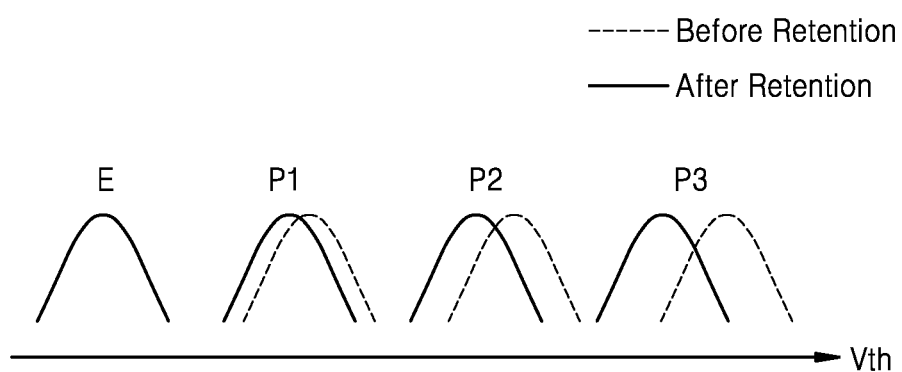
FIGS. 8A and 8B are diagrams illustrating a distribution of a memory cell connected to a selected word line according to an exemplary embodiment the inventive concept.
Figure 8B:
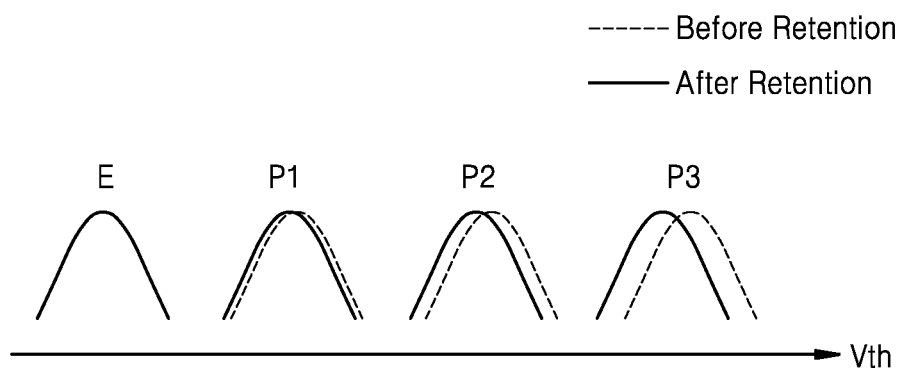

FIGS. 8A and 8B are diagrams illustrating a distribution of a memory cell connected to a selected word line according to an exemplary embodiment of the inventive concept. FIG. 8A illustrates a case where an adjacent word line has a low-level program state (e.g., the erase state E), and FIG. 8B illustrates a case where an adjacent word line has a high-level program state (e.g., the third program state P3).

According to an exemplary embodiment of the inventive concept, the adjacent word line voltage applied to the adjacent word line in the verify operation has a lower voltage level than the read word line voltage, and the bit line voltage applied to the bit line has a higher voltage level than the bit line sensing voltage. Accordingly, the distribution of the selected memory cell may be determined differently according to the program state of the adjacent memory cell connected to the adjacent word line.

Referring to a broken-line graph of FIG. 8A, in the verify operation after the program operation, since the adjacent memory cell has a low-level program state, the cell distribution is formed at a higher level with respect to the selected memory cell. When the retention progresses with the lapse of a predetermined time, a relatively large charge loss occurs due to the threshold voltage level difference between the adjacent word line and the selected word line and the cell distribution shifts to the left (i.e., the low voltage) more than in the case of FIG. 8B to be formed as a solid-line graph.

Referring to a broken-line graph of FIG. 8B, in the verify operation after the program operation, since the adjacent memory cell has a high-level program state, the cell distribution is formed at a relatively low level with respect to the selected memory cell in the nonvolatile memory device 10 due to the influence thereon. When the retention progresses with the lapse of a predetermined time, a relatively small charge loss occurs due to the threshold voltage level difference between the adjacent word line and the selected word line and the cell distribution shifts to the left (i.e., the low voltage) less than in the case of FIG. 8A to be formed as a solid-line graph.

As described above, since the verify operation on the selected memory cell is performed differently according to the program state of the adjacent memory cell, the cell distribution between the memory cells may be maintained uniform despite the program state of the adjacent memory cell after the retention and the program operation may be improved.

Figure 9:
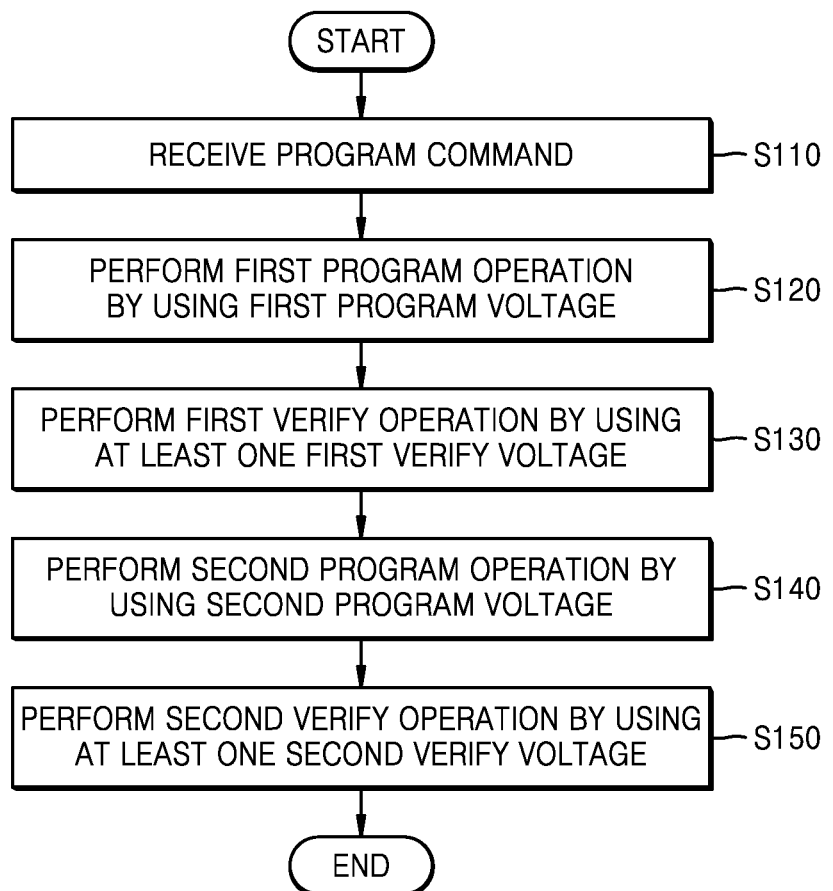
FIG. 9 is a flowchart illustrating a method of operating a nonvolatile memory device, according to an exemplary embodiment the inventive concept.

FIG. 9 is a flowchart illustrating a method of operating a nonvolatile memory device, according to an exemplary embodiment of the inventive concept.

Referring to FIGS. 2 and 9, the nonvolatile memory device 10 receives a program command CMD (S110). For example, the non-volatile memory device 10 may receive the program command CMD from the memory controller 20.

The control logic 140 performs a first program operation by using a first program voltage (S120). For example, the control logic 140 can perform the first program operation on a first memory cell (e.g., see MC2 in FIG. 3) connected to a first word line (e.g., see WL2 in FIG. 2) by applying the first program voltage to the first word line, where the first memory cell is adjacent a second memory cell (e.g., see MC1 in FIG. 3) connected to a second word line (e.g., see WL1) adjacent the first word line, and the first memory cell is adjacent a third memory cell (e.g., see MC3 in FIG. 3) connected to a third word line (e.g., see WL3 in FIG. 3) adjacent the first word line. In an embodiment, while the first program voltage is being applied to the first word line, a voltage different from the first program voltage is applied to the second and third word lines to prevent the adjacent memory cells from being written with data. The first program voltage is sufficient to enable the first memory cell to be written with data.

Also, the control logic 140 performs a first verify operation by using at least one first verify voltage (S130). In an embodiment, the first verify operation is performed after the first program operation has completed. In an embodiment, the first verify operation is used to verify that the first memory cell has been properly programmed. In an embodiment, the first verify operation is performed by applying a verify voltage to the first word line connected to the first memory cell that was programmed and applying a voltage (referred to as a first adjacent word line voltage) to the second word line connected to the second memory cell that was not programmed and/or applying a voltage (referred to as a second adjacent word line voltage) to the third word line connected to the third memory cell that was not programmed. In an embodiment, the first verify operation is further performed by applying a first bit line voltage to the bit line connected to the memory cell that was programmed and the adjacent memory cells that were not programmed.

When the first verify operation has completed, the control logic 140 performs a second program operation by using a second program voltage (S140). For example, the control logic 140 can perform the second program operation on the first memory cell (e.g., see MC2 in FIG. 3) connected to a first word line (e.g., see WL2 in FIG. 2) by applying the second program voltage to the first word line. In an embodiment, while the second program voltage is being applied to the second word line, a voltage different from the second program voltage is applied to the second and third word lines to prevent the adjacent memory cells from being written with data. The second program voltage is sufficient to enable the first memory cell to be written with data.

Also, the control logic 140 performs a second verify operation by using at least one second verify voltage (S150). In an embodiment, the second verify operation is used to verify that the first memory cell has been properly programmed. In an embodiment, the second verify operation is performed by applying a verify voltage to the first word line connected to the first memory cell that was programmed and applying a voltage (referred to as a first adjacent word line voltage) to the second word line connected to the second memory cell that was not programmed and/or applying a voltage (referred to as a second adjacent word line voltage) to the third word line connected to the third memory cell that was not programmed. In an embodiment, the first second operation is further performed by applying a second bit line voltage to the bit line connected to the memory cell that was programmed and the adjacent memory cells that were not programmed.

According to an exemplary embodiment of the inventive concept, at least one of the first adjacent word line voltage and the second adjacent word line voltage has a lower voltage level than a read word line voltage. For example, the first adjacent word line voltage applied to the second word line during the verification operation of the first memory cell may be lower than an a read word line voltage applied to the second word line during a read of the second memory cell that is adjacent the first memory cell that was programmed. For example, the second adjacent word line voltage applied to the third word line during the verification operation of the first memory cell may be lower than an a read word line voltage applied to the third word line during a read of the third memory cell that is adjacent the first memory cell that was programmed. According to another exemplary embodiment, at least one of the first bit line voltage and the second bit line voltage has a higher voltage level than a bit line sensing voltage. For example, the bit line voltage that was applied to the bit line during the verification of the first memory cell may be higher than the bit line sensing voltage that is applied to the bit line to read data from the first memory cell that was programmed or data from the second and third memory cells that were not programmed.

In an embodiment, the voltage levels of the first adjacent word line voltage and the second adjacent word line voltage are equal to one another. In another embodiment, the voltage levels of the first adjacent word line voltage and the second adjacent word line voltage are different from each other. In an embodiment, the voltage levels of the first bit line voltage and the second bit line voltage are equal to one another. In another embodiment, the voltage levels of the first bit line voltage and the second bit line voltage are different from each other.

Figure 10A:
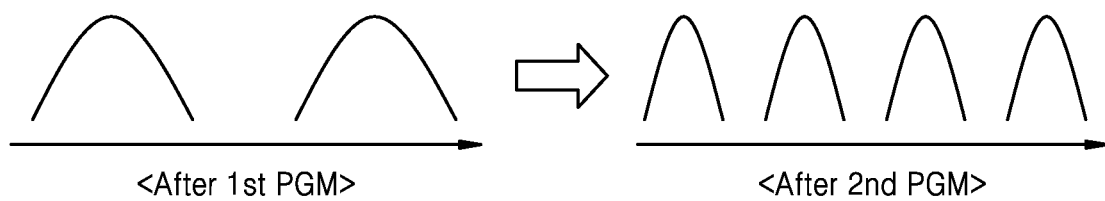
FIGS. 10A and 10B are cell distribution diagrams illustrating a program operation according to an exemplary embodiment the inventive concept.
Figure 10B:
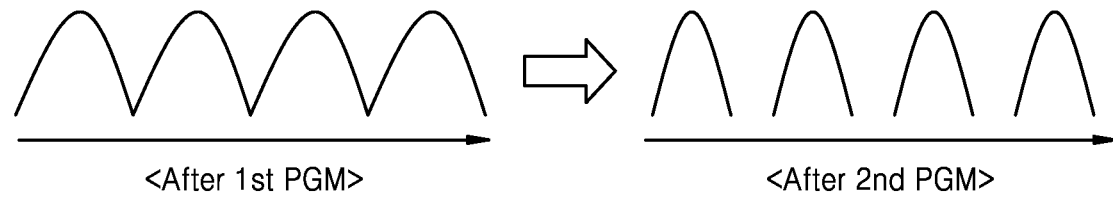

FIGS. 10A and 10B are cell distribution diagrams illustrating a program operation according to an exemplary embodiment of the inventive concept. In detail, FIG. 10A illustrates a program operation for dividing a memory cell into four program states through a shadow program, and FIG. 10B illustrates a program operation for dividing a memory cell into four program states through a reprogram.

Referring to FIGS. 2 and 10A, the nonvolatile memory device 10 forms the memory cell into two distributions by applying a first program voltage and at least one first verify voltage to the memory cell array 110. The application of the first program voltage to the memory cell array 110 may be referred to as a first program operation (1$^{st}$ PGM). The application of the at least one first verify voltage to the memory cell 110 may be referred to as first verify operation. After the first program operation (1st PGM) and the first verify operation complete, the nonvolatile memory device 10 forms the memory cell into four distributions by applying a second program voltage and at least one second verify voltage to the memory cell array 110. The application of the second program voltage to the memory cell array 110 may be referred to as a second program operation (2nd PGM). The application of the at least one second verify voltage to the memory cell 110 may be referred to as a second verify operation.

In another embodiment, referring to FIGS. 2 and 10b, the nonvolatile memory device 10 forms the memory cell into four distributions by applying a first program voltage and at least one first verify voltage to the memory cell array 110. After the first program operation (1st PGM) and the first verify operation complete, the nonvolatile memory device 10 forms the memory cell into four distributions through a fine program operation by applying a second program voltage and at least one second verify voltage to the memory cell array 110.

Figure 11:
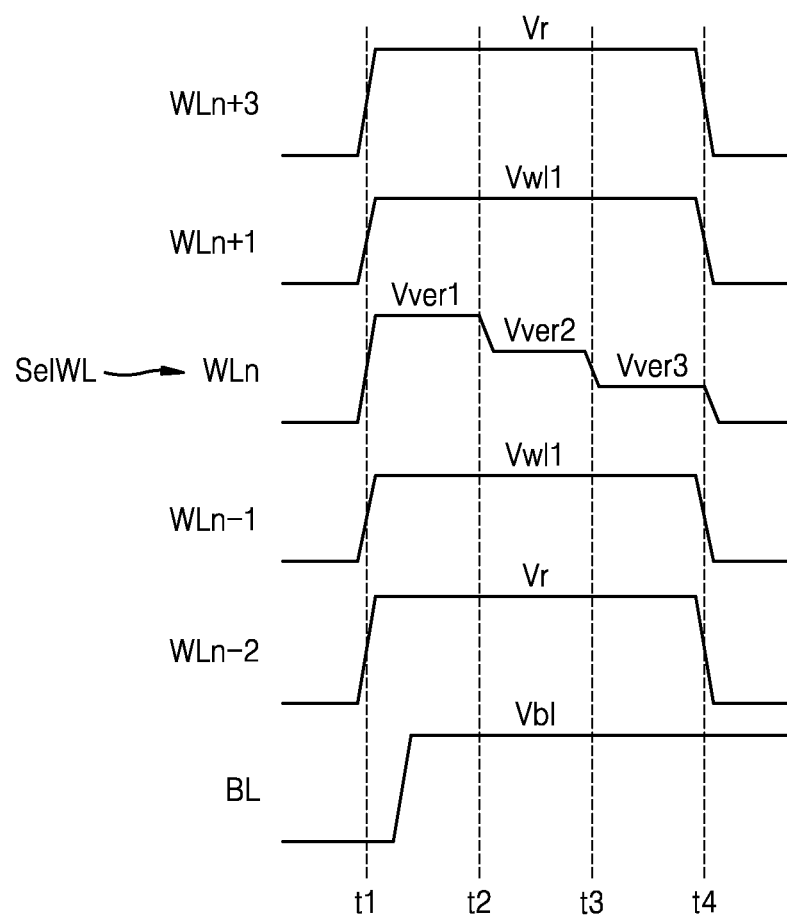
FIG. 11 is a timing diagram illustrating an operation of a nonvolatile memory device according to an exemplary embodiment the inventive concept.

FIG. 11 is a timing diagram illustrating an operation of a nonvolatile memory device according to an exemplary embodiment of the inventive concept.

Referring to FIGS. 2 and 11, the nth word line WLn is a selected word line SelWL connected to a selected memory cell to be programmed. Also, the memory cell array 110 may be connected to the row decoder 150 through a plurality of word lines arranged in the order of the (n−2)th word line WLn−2, the (n−1)th word line WLn−1, the nth word line WLn, the (n+1)th word line WLn+1, and the (n+2)th word line WLn+2.

From a first time t1 to a fourth time t4, a first verify voltage Vver1, a second verify voltage Vver2, and a third verify voltage Vver3 are sequentially applied to the nth word line WLn. In an embodiment, a voltage level of the verify voltages Vver1-Vver3 gradually decrease sequentially. Also, a first word line voltage Vwl1 is applied to the (n−1)th word line WLn−1 and the (n+1)th word line WLn+1 adjacent to the nth word line WLn, and a read voltage Vr may be applied to the other word lines WLn−2 and WLn+2.

According to an embodiment, the first word line voltage Vwl1 applied to the (n−1)th word line WLn−1 and the (n+1)th word line WLn+1 that are adjacent word lines have a lower voltage level than the read voltage Vr. In an exemplary embodiment, the first word line voltage Vwl1 has a lower voltage level than a voltage applied to the (n−1)th word line WLn−1 and the (n+1)th word line WLn+1 in a read operation.

A bit line voltage Vb1 may be applied to a bit line BL connected to the selected memory cell after a predetermined time from the first time t1. According to an embodiment, the bit line voltage Vb1 has a higher voltage level than a bit line sensing voltage applied to the bit line BL in a read operation.

Figure 12:
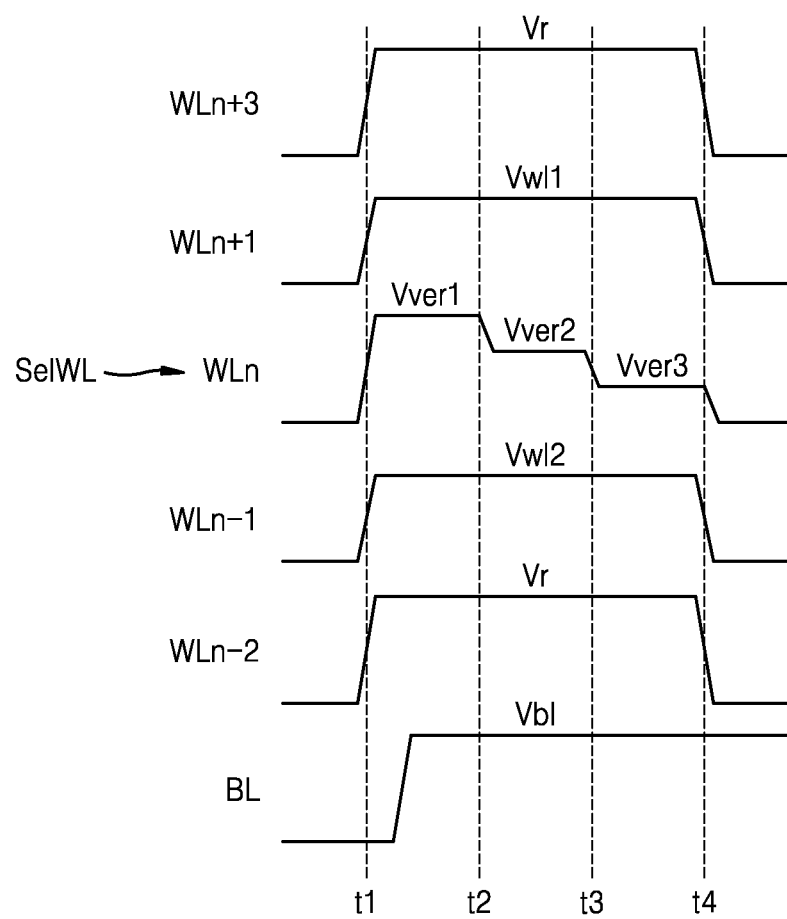
FIG. 12 is a timing diagram illustrating an operation of a nonvolatile memory device according to an exemplary embodiment the inventive concept.

FIG. 12 is a timing diagram illustrating an operation of a nonvolatile memory device according to an exemplary embodiment of the inventive concept. Redundant descriptions already given with reference to FIG. 11 will be omitted for conciseness.

Referring to FIG. 12, from a first time t1 to a fourth time t4, a first word line voltage Vwl1 is applied to the (n+1)th word line WLn+1 and a second word line voltage Vwl2 may be applied to the (n−1)th word line WLn−1. According to an embodiment, at least one of the first word line voltage Vwl1 and the second word line voltage Vwl2 has a lower voltage level than a read voltage Vr and a voltage applied to the (n−1)th word line WLn−1 and the (n+1)th word line WLn+1 in a read operation.

In an example, since the first word line voltage Vwl1 corresponding to the first verify operation described above with reference to FIG. 9 is applied before the program operation on the (n+1)th word line WLn+1, the first word line voltage Vwl1 may have the same voltage level as the read voltage Vr; and since the second word line voltage Vwl2 is applied after the program operation on the (n−1)th word line WLn−1, the second word line voltage Vwl2 may have a lower voltage level than the read voltage Vr. In another example, the first word line voltage Vwl1 and the second word line voltage Vwl2 have different voltage levels from one another and have lower voltage levels than the read voltage Vr.

Figure 13:
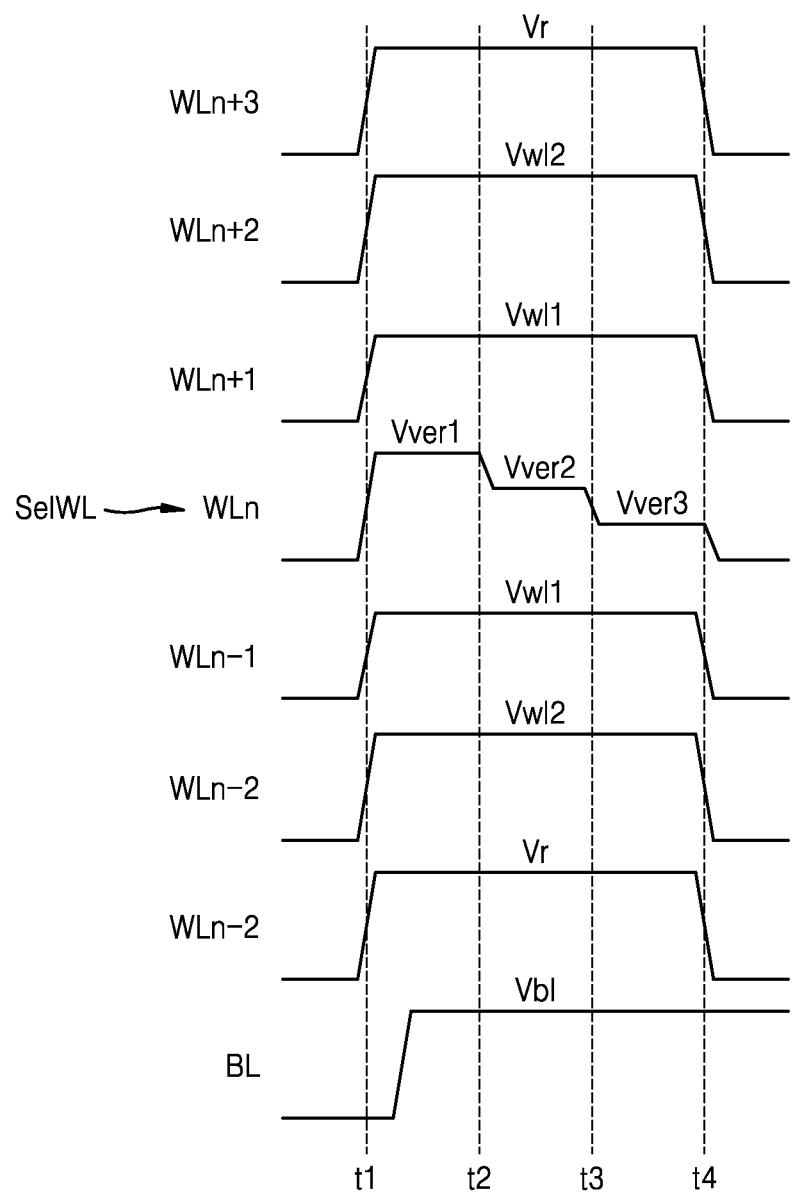
FIG. 13 is a timing diagram illustrating an operation of a nonvolatile memory device according to an exemplary embodiment the inventive concept.

FIG. 13 is a timing diagram illustrating an operation of a nonvolatile memory device according to an exemplary embodiment of the inventive concept. Redundant descriptions already given with reference to FIG. 11 will be omitted for conciseness.

Referring to FIG. 13, the nth word line WLn is a selected word line SelWL connected to a selected memory cell to be programmed. Also, the memory cell array 110 may be connected to the row decoder 150 through a plurality of word lines arranged in the order of the (n−3)th word line WLn−3, the (n−2)th word line WLn−2, the (n−1)th word line WLn−1, the nth word line WLn, the (n+1)th word line WLn+1, the (n+2)th word line WLn+2, and the (n+3)th word line WLn+3.

From a first time t1 to a fourth time t4, a first verify voltage Vver1, a second verify voltage Vver2, and a third verify voltage Vver3 are sequentially applied to the nth word line WLn. Also, a first word line voltage Vwl1 is applied to the (n−1)th word line WLn−1 and the (n+1)th word line WLn+1 adjacent to the nth word line WLn, and a second word line voltage Vwl2 is applied to the (n−2)th word line WLn−2 and the (n+2)th word line WLn+2. A read voltage Vr may be applied to the other word lines WLn−3 and WLn+3.

According to an embodiment, at least one of the first word line voltage Vwl1 and the second word line voltage Vwl2 have a lower voltage level than the read voltage Vr. According to an embodiment, at least one of the first word line voltage Vwl1 and the second word line voltage Vwl2 have a lower voltage level than a voltage applied to the (n−1)th word line WLn−1 and the (n+1)th word line WLn+1 in a read operation.

In an embodiment, the second word line voltage Vwl2 has a higher voltage level than the first word line voltage Vwl1. Accordingly, the charge loss of a charge storage layer connected to the (n−1)th word line WLn−1 and the (n+1)th word line WLn+1 may be minimized.

FIG. 13 illustrates an embodiment in which the same first word line voltage Vwl1 is applied to the (n−1)th word line WLn−1 and the (n+1)th word line WLn+1 and the same second word line voltage Vwl2 is applied to the (n−2)th word line WLn−2 and the (n+2)th word line WLn+2. However, this is merely an exemplary embodiment as adjacent word line voltages having different voltage levels may be applied to the (n−1)th word line WLn−1 and the (n+1)th word line WLn+1 and adjacent word line voltages having different voltage levels may also be applied to the (n−2)th word line WLn−2 and the (n+2)th word line WLn+2.

Also, FIG. 13 illustrates an embodiment in which an adjacent word line voltage having a lower voltage level than the read voltage Vr is applied to the (n−2)th word line WLn−2, the (n−1)th word line WLn−1, the (n+1)th word line WLn+1, and the (n+2)th word line WLn+2. However, the inventive concept is not limited thereto and may also be applied to an embodiment in which an adjacent word line voltage having a lower voltage level than the read voltage Vr is applied to the selected word line SelWL and m (m is a natural number greater than or equal to 1) adjacent word lines.

Figure 14:
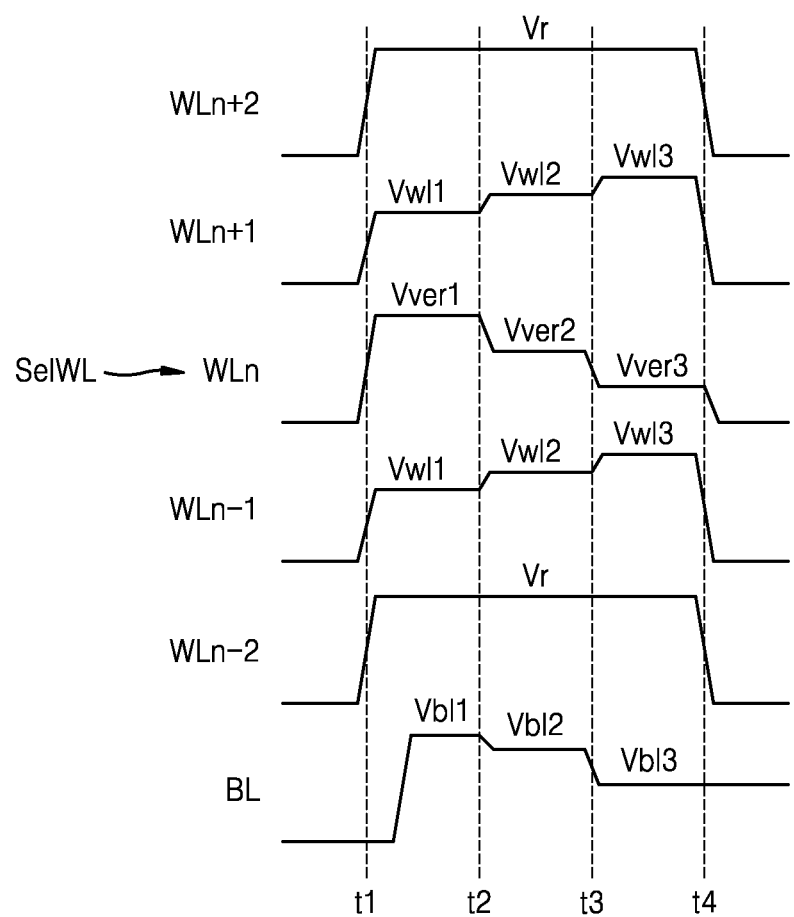
FIG. 14 is a timing diagram illustrating an operation of a nonvolatile memory device according to an exemplary embodiment the inventive concept.

FIG. 14 is a timing diagram illustrating an operation of a nonvolatile memory device according to an exemplary embodiment of the inventive concept. Redundant descriptions already given with reference to FIG. 11 will be omitted for conciseness.

Referring to FIG. 14, a first verify voltage Vver1 is applied to the nth word line WLn from a first time t1 to a second time t2. Also, a first word line voltage Vwl1 is applied to the (n−1)th word line WLn−1 and the (n+1)th word line WLn+1 adjacent to the nth word line WLn, and a first bit line voltage Vbl1 is applied to a bit line BL.

A second verify voltage Vver2 is applied to the nth word line WLn from the second time t2 to a third time t3. Also, a second word line voltage Vwl2 is applied to the (n−1)th word line WLn−1 and the (n+1)th word line WLn+1 adjacent to the nth word line WLn, and a second bit line voltage Vbl2 is applied to the bit line BL.

A third verify voltage Vver3 is applied to the nth word line WLn from the third time t3 to a fourth time t4. Also, a third word line voltage Vwl3 is applied to the (n−1)th word line WLn−1 and the (n+1)th word line WLn+1 adjacent to the nth word line WLn, and a third bit line voltage Vbl3 is applied to the bit line BL.

The first through third verify voltages Vver1-Vver3 and the first through third bit line voltages Vbl1-Vbl3 may sequentially decrease from times t1-t4.

In an embodiment, the first word line voltage Vwl1, the second word line voltage Vwl2, and the third word line voltage Vwl3 have voltage levels different from one another. In an embodiment, the first word line voltage Vwl1 has a lower voltage level than the second word line voltage Vwl2, and the second word line voltage Vwl2 has a lower voltage level than the third word line voltage Vwl3. In an embodiment, the third word line voltage Vwl3 has a voltage level lower than or equal to a read voltage Vr. When a verify voltage having a high voltage level is applied to a selected word line SelWL, the influence from the adjacent word lines WLn−1 and WLn+1 may be small. According to an embodiment, when a verify voltage having a relatively high voltage level is applied to the selected word line SelWL, the influence of the adjacent word line on the selected word line SelWL may be maximized by applying an adjacent word line voltage having a relatively low voltage level to the adjacent word lines WLn−1 and WLn+1.

In an embodiment, the first bit line voltage Vbl1, the second bit line voltage Vbl2, and the third bit line voltage Vbl3 have voltage levels different from one another. In an embodiment, the first bit line voltage Vbl1 has a lower voltage level than the second bit line voltage Vbl2, and the second bit line voltage Vbl2 has a lower voltage level than the third bit line voltage Vbl3. In an embodiment, the third bit line voltage Vbl3 has a voltage level lower than or equal to the read voltage Vr. When a verify voltage having a high voltage level is applied to the selected word line SelWL, the influence from the adjacent word lines WLn−1 and WLn+1 may be small. Therefore, when a verify voltage having a relatively high voltage level is applied to the selected word line SelWL, the influence of the adjacent word lines WLn−1 and WLn+1 on the selected word line SelWL may be maximized by applying a bit line voltage having a relatively high voltage level to the bit line BL.

Figure 15:
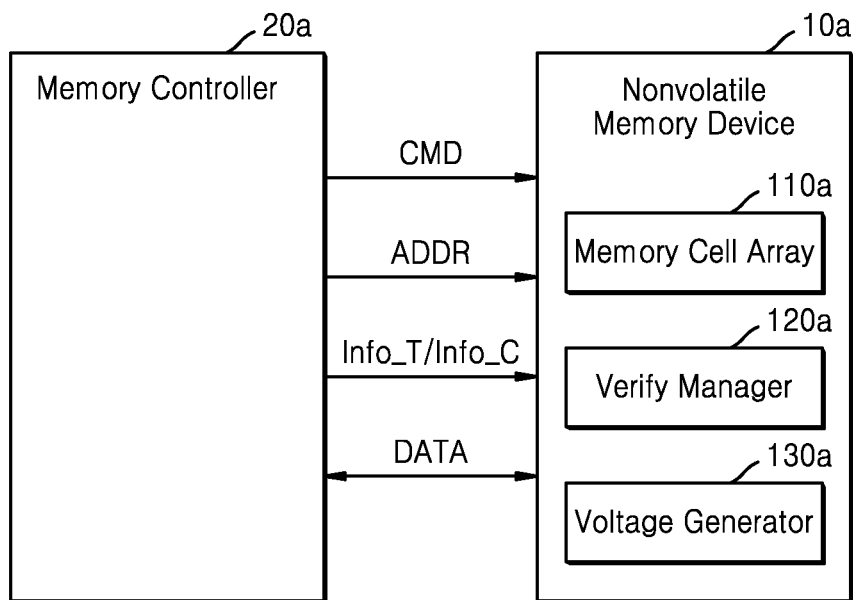
FIG. 15 is a block diagram illustrating a nonvolatile memory system according to an exemplary embodiment the inventive concept.

FIG. 15 is a block diagram illustrating a nonvolatile memory system according to an exemplary embodiment of the inventive concept. Redundant descriptions already given with reference to FIG. 1 will be omitted for conciseness.

Referring to FIG. 15, a nonvolatile memory system 1a includes a memory controller 20a and a nonvolatile memory device 10a, and the nonvolatile memory device 10a includes a memory cell array 110a, a verify manager 120a, and a voltage generator 130a.

In an exemplary embodiment, the memory controller 20a further outputs at least one of temperature information Info_T and cycle information Info_C in addition to a command CMD and an address ADDR to the nonvolatile memory device 10a. The verify manager 120a may receive the temperature information Info_T or the cycle information Info_C and determine an adjacent word line voltage and a bit line voltage based thereon. The temperature information Info_T may be information about the ambient temperature of the nonvolatile memory device 10a, and the cycle information Info_C may be the number of program-erase cycles (i.e., program-erase cycle count) of the nonvolatile memory device 10a. In an embodiment, the cycle information Info_C represents information about how many times the program and erase operation has been performed on the nonvolatile memory device 10a.

In an embodiment, the verify manager 120a acquires information about the ambient temperature of the nonvolatile memory device 10a based on the temperature information Info_T and determines the adjacent word line voltage to be lower and the bit line voltage to be higher as the ambient temperature increases. For example, the verify manager 120a could determine the adjacent word line voltage to be a first word line voltage and the bit line voltage to be a first bit line voltage when the ambient temperature is a first temperature, and determine the adjacent word line voltage to be a second word line voltage lower than the first word line voltage and the bit line voltage to be a second bit line voltage higher than the first bit line voltage when the ambient temperature is a second temperature higher than the first temperature.

In an embodiment, the verify manager 120a acquires information about the program-erase cycle count of the nonvolatile memory device 10a based on the cycle information Info_C and determines the adjacent word line voltage to be lower and the bit line voltage to be higher as the program-erase cycle count increases. For example, the verify manager 120a could determine the adjacent word line voltage to be a first word line voltage and the bit line voltage to be a first bit line voltage when the program-erase cycle count is a first count, and determine the adjacent word line voltage to be a second word line voltage lower than the first word line voltage and the bit line voltage to be a second bit line voltage higher than the first bit line voltage when the program-erase cycle count is a second count higher than the first count.

Figure 16:
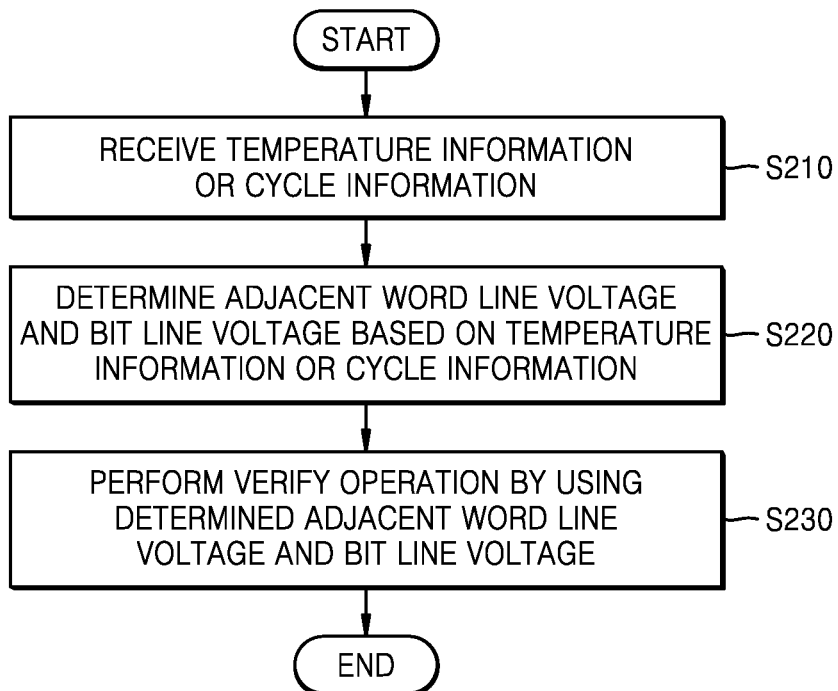
FIG. 16 is a flowchart illustrating an operation of a nonvolatile memory device according to an exemplary embodiment the inventive concept.

FIG. 16 is a flowchart illustrating an operation of a nonvolatile memory device according to an exemplary embodiment of the inventive concept.

Referring to FIGS. 15 and 16, the verify manager 120a receives temperature information Info_T or cycle information Info_C from the memory controller 20a (S210). The verify manager 120a determines an adjacent word line voltage and a bit line voltage based on the received temperature information Info_T or cycle information Info_C (S220). The nonvolatile memory device 10a performs a verify operation by using the determined adjacent word line voltage and bit line voltage (S230).

Figure 17:
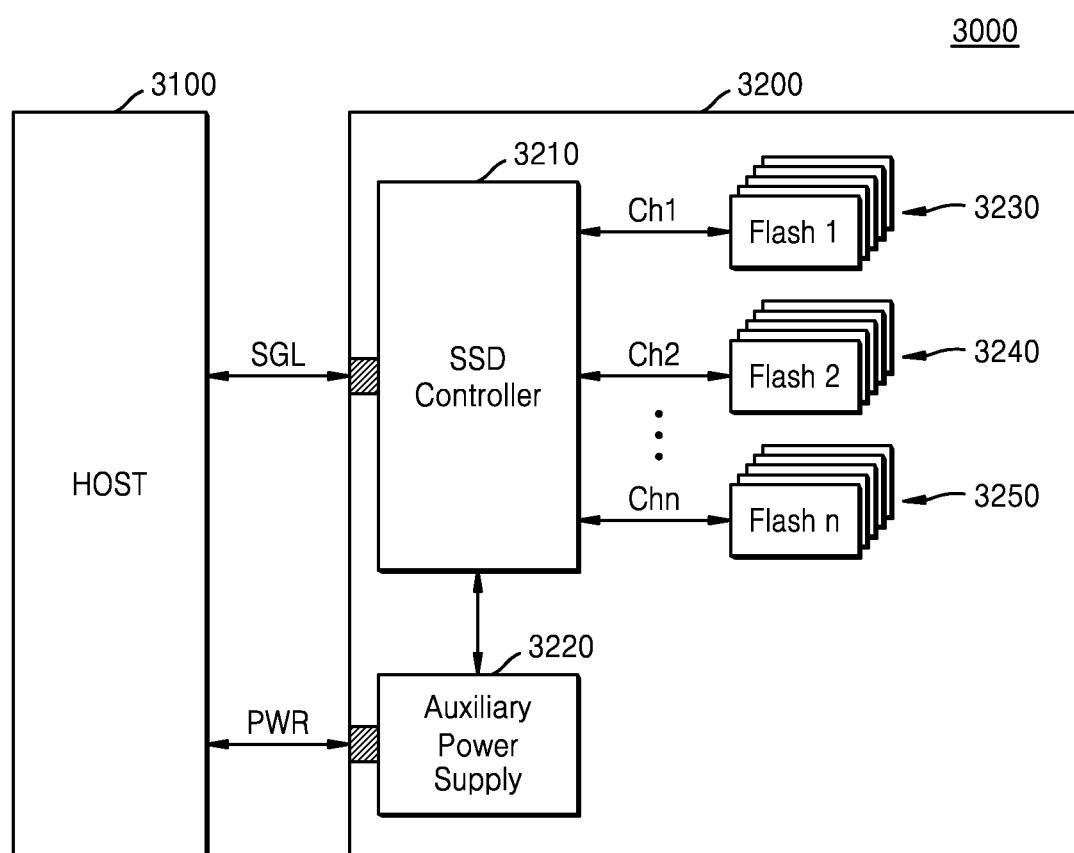
FIG. 17 is a block diagram illustrating a solid state drive (SSD) system according to an exemplary embodiment the inventive concept.

FIG. 17 is a block diagram illustrating a solid state drive (SSD) system according to an exemplary embodiment of the inventive concept.

Referring to FIG. 17, an SSD system 3000 includes a host 3100 and an SSD 3200. The SSD 3200 may exchange signals SGL with the host 3100 through a signal connector and receive an input of power PWR through a power connector. The SSD 3200 may include an SSD controller 3210, an auxiliary power supply 3220, and a plurality of memory devices 3230, 3240, and 3250. In this case, the SSD 3200 may be implemented by using the embodiments illustrated in FIGS. 1 to 16.

In particular, the plurality of memory devices 3230 to 3250 may apply a voltage lower than a read voltage to an adjacent word line and apply a voltage higher than a bit line sensing voltage to a bit line, thereby increasing the influence of the adjacent word line to a selected word line. Accordingly, the voltage level of the threshold voltage of the selected word line may be determined according to the program state of the adjacent word line, and the distribution of the memory cell may be improved after the retention.

A memory card, a nonvolatile memory device, and a memory controller according to the inventive concept may be mounted by using various types of packages.

Figure 18:
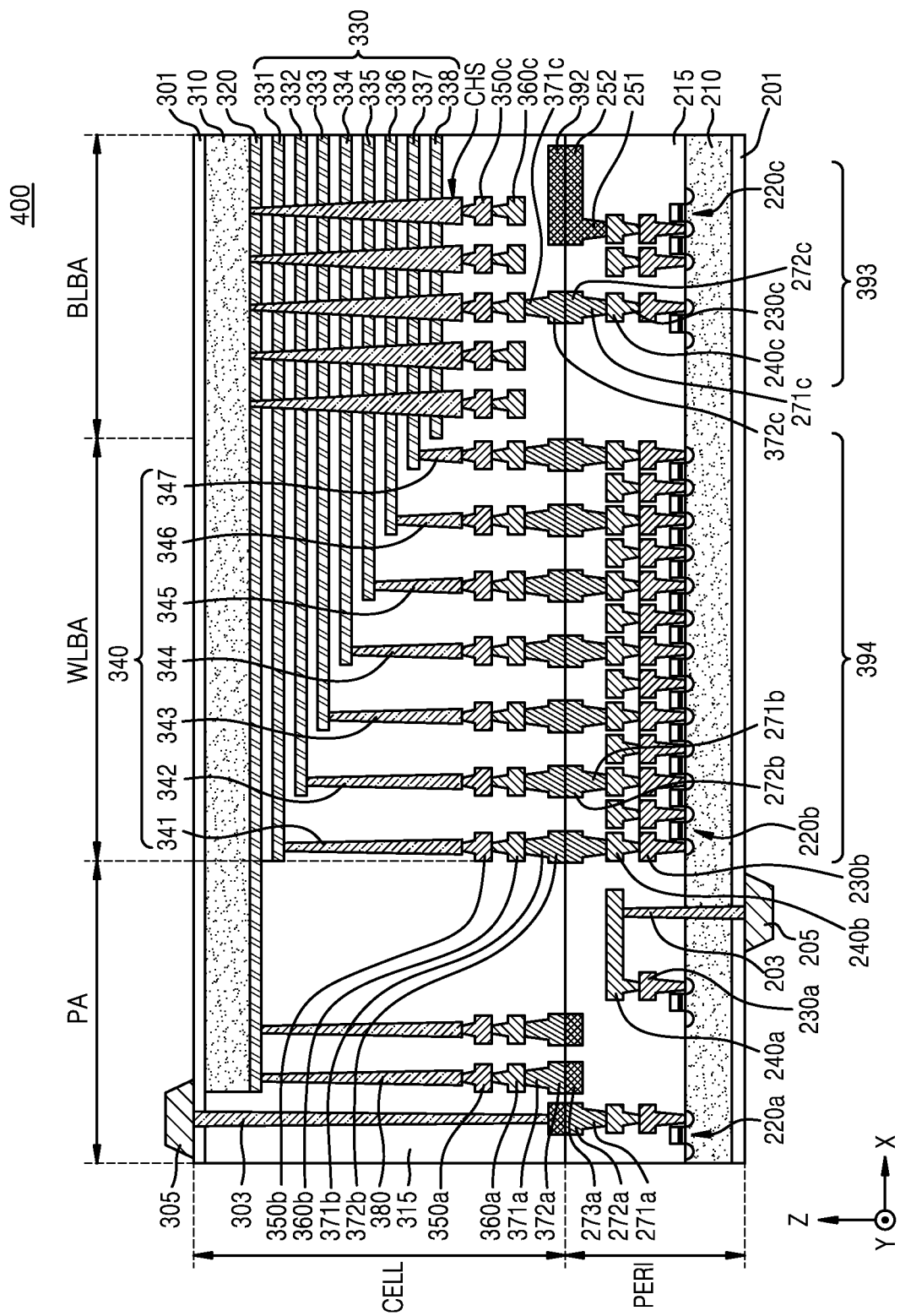
FIG. 18 is a perspective view illustrating the nonvolatile memory device according to an exemplary embodiment the inventive concept

FIG. 18 is a perspective view illustrating a nonvolatile memory device according to an exemplary embodiment the inventive concept. A nonvolatile memory device 400 of the FIG. 18 may be same as the nonvolatile memory device 10 of FIG. 1.

Referring to FIG. 18, a nonvolatile memory device 400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high resistance, and the second metal layers 240a, 240b, and 240c may be formed of copper having relatively low resistance.

In an example embodiment illustrated in FIG. 18, although the first metal layers 230a, 230b, and 230c and the second metal layers 240a, 240b, and 240c are shown and described, they are not limited thereto, and one or more metal layers may be further formed on the second metal layers 240a, 240b, and 240c. At least a portion of the one or more metal layers formed on the second metal layers 240a, 240b, and 240c may be formed of aluminum or the like having a lower resistance than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically connected to c in a bonding manner, and the lower bonding metals 271b and 272b and the upper bonding metals 371b and 372b may be formed of aluminum, copper, tungsten, or the like. Further, the upper bonding metals 371*b* and 372*b* in the cell region CELL may be referred to as first metal pads and the lower bonding metals 271*b* and 272*b* in the peripheral circuit region PERI may be referred to as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction, perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350*c* and a second metal layer 360*c*. For example, the first metal layer 350*c* may be a bit line contact, and the second metal layer 360*c* may be a bit line. In an example embodiment, the bit line 360*c* may extend in a first direction (a Y-axis direction), parallel to the upper surface of the second substrate 310.

In an example embodiment illustrated in FIG. 18, an area in which the channel structure CH, the bit line 360*c*, and the like are disposed may be defined as the bit line bonding area BLBA. In the bit line bonding area BLBA, the bit line 360*c* may be electrically connected to the circuit elements 220*c* providing a page buffer 393 in the peripheral circuit region PERI. For example, the bit line 360*c* may be connected to upper bonding metals 371*c* and 372*c* in the cell region CELL, and the upper bonding metals 371*c* and 372*c* may be connected to lower bonding metals 271*c* and 272*c* connected to the circuit elements 220*c* of the page buffer 393.

In the word line bonding area WLBA, the plurality of word lines 330 may extend in a second direction (an X-axis direction), parallel to the upper surface of the second substrate 310, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350*b* and a second metal layer 360*b* may be connected to an upper portion of the plurality of cell contact plugs 340 connected to the plurality of word lines 330, sequentially. The plurality of cell contact plugs 340 may be connected to the circuit region PERI by the upper bonding metals 371*b* and 372*b* of the cell region CELL and the lower bonding metals 271*b* and 272*b* of the peripheral circuit region PERI in the word line bonding area WLBA.

The plurality of cell contact plugs 340 may be electrically connected to the circuit elements 220*b* providing a row decoder 394 in the peripheral circuit region PERI. In an example embodiment, operating voltages of the circuit elements 220*b* providing the row decoder 394 may be different than operating voltages of the circuit elements 220*c* providing the page buffer 393. For example, operating voltages of the circuit elements 220*c* providing the page buffer 393 may be greater than operating voltages of the circuit elements 220*b* providing the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350*a* and a second metal layer 360*a* may be stacked on an upper portion of the common source line contact plug 380, sequentially. For example, an area in which the common source line contact plug 380, the first metal layer 350*a*, and the second metal layer 360*a* are disposed may be defined as the external pad bonding area PA.

Input-output pads 205 and 305 may be disposed in the external pad bonding area PA. Referring to FIG. 18, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220*a*, 220*b*, and 220*c* disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 18, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220*a*, 220*b*, and 220*c* disposed in the peripheral circuit region PERI through a second input-output contact plug 303.

According to embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 18, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 205 and the second input-output pad 305 may be selectively formed. For example, the nonvolatile memory device 400 may include only the first input-output pad 205 disposed on the first substrate 210 or the second input-output pad 305 disposed on the second substrate 310. Alternatively, the nonvolatile memory device 400 may include both the first input-output pad 205 and the second input-output pad 305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the nonvolatile memory device 400 may include a lower metal pattern 273*a*, corresponding to an upper metal pattern 372*a* formed in an uppermost metal layer of the cell region CELL, and having the same shape as the upper metal pattern 372*a* of the cell region CELL, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu—Cu bonding.

Further, the bit line bonding area BLBA, an upper metal pattern 392, corresponding to a lower metal pattern 252 formed in the uppermost metal layer of the peripheral circuit region PERI, and having the same shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

The exemplary embodiments of the inventive concept have been described above with reference to the drawings. Although particular terms are used herein to describe the embodiments, they are merely used to describe the technical idea of the inventive concept and are not intended to limit the scope of the inventive concept. Therefore, those of ordinary skill in the art will understand that various modifications and other equivalent embodiments may be derived therefrom.

What is claimed is:

1. A nonvolatile memory device comprising:
a memory cell array comprising a plurality of memory cells, a plurality of word lines and a bit line connected to the memory cells, wherein each memory cell is connected to one of the word lines;
a voltage generator configured to supply a plurality of supply voltages to the memory cell array; and
a control logic circuit configured to program a selected one of the memory cells connected to a selected word line of the plurality of word lines into a first program state by controlling the voltage generator and to control a verify operation on the memory cell array by controlling the voltage generator;
wherein the control logic circuit controls a first word line voltage applied to an adjacent word line adjacent to the selected word line among at least one unselected word line not to be programmed among the plurality of word lines in the verify operation to be different from a read voltage level of a read voltage applied in a read operation of the nonvolatile memory device and controls a bit line voltage applied to the bit line in the read operation,
wherein the control logic circuit controls the voltage generator to apply a plurality of different and decreasing verify voltages to the selected word line in the verify operation, wherein the memory cell array is formed in a memory cell region including a first metal pad, and
wherein the voltage generator and the control logic circuit are formed in a peripheral circuit region including a second metal pad connected to the memory cell region by the first metal pad and the second metal pad.

2. The nonvolatile memory device of claim 1, wherein the control logic circuit controls the voltage generator to apply a first program voltage to the selected word line, to apply a first verify voltage to the selected word line, to apply a second program voltage to the selected word line, and to apply a second verify voltage to the selected word line.

3. The nonvolatile memory device of claim 1, wherein the control logic circuit controls a second word line voltage applied to non-adjacent word line not adjacent to the selected word line among the at least one unselected word line, and wherein a level of the first word line voltage is different than a level of the second word line voltage.

4. The nonvolatile memory device of claim 3, wherein the level of the first word line voltage is lower than the level of the second word line voltage.

5. The nonvolatile memory device of claim 1, wherein the control logic circuit controls a bit line voltage applied to the bit line in the verify operation to be higher than a bit line sensing voltage applied to the bit line in the read operation.

6. The nonvolatile memory device of claim 1, wherein the adjacent word line comprises a first adjacent word line located directly above the selected word line and a second adjacent word line located directly below the selected word line, and wherein the control logic circuit controls the voltage generator to apply the first word line voltage having a first level among the supply voltages to the first adjacent word line and apply the first word line voltage having the same first level to the second adjacent word line in the verify operation.

7. A nonvolatile memory device comprising:
a memory cell array comprising a plurality of memory cells, a plurality of word lines and a bit line connected to the memory cells, wherein each memory cell is connected to one of the plurality of word lines;
a voltage generator configured to supply a plurality of supply voltages to the memory cell array; and
a control logic circuit configured to program a selected one of the memory cells connected to a selected word line of the plurality of word lines into a first program state by controlling the voltage generator and to control a verify operation on the memory cell array by controlling the voltage generator;
wherein the control logic circuit controls a first word line voltage applied to an adjacent word line adjacent to the selected word line among at least one unselected word line not to be programmed among the plurality of word lines in the verify operation to be different from a read voltage level of a read voltage applied in a read operation of the nonvolatile memory device and controls a bit line voltage applied to the bit line in the read operation,
wherein the control logic circuit controls a second word line voltage applied to non-adjacent word line not adjacent to the selected word line among the at least one unselected word line in the verify operation, wherein a level of the first word line voltage is lower than a level of the second word line voltage,
wherein the memory cell array is formed in a memory cell region including a first metal pad, and wherein the voltage generator and the control logic circuit are formed in a peripheral circuit region including a second metal pad connected to the memory cell region by the first metal pad and the second metal pad.

8. The nonvolatile memory device of claim 7, wherein the control logic circuit controls the voltage generator to apply a first program voltage to the selected word line, to apply a first verify voltage to the selected word line, to apply a second program voltage to the selected word line, and to apply a second verify voltage to the selected word line.

9. The nonvolatile memory device of claim 7, wherein the control logic circuit controls the voltage generator to apply a plurality of different and decreasing verify voltages to the selected word line in the verify operation.

10. The nonvolatile memory device of claim 7, wherein the control logic circuit controls a bit line voltage applied to the bit line in the verify operation to be higher than a bit line sensing voltage applied to the bit line in the read operation.

11. The nonvolatile memory device of claim 7, wherein the adjacent word line comprises a first adjacent word line located directly above the selected word line and a second adjacent word line located directly below the selected word line, and wherein the control logic circuit controls the voltage generator to apply the first word line voltage having a first level among the supply voltages to the first adjacent word line and apply the first word line voltage having the same first level to the second adjacent word line in the verify operation.

12. A method of operating a nonvolatile memory device comprising a memory cell array comprising a plurality of memory cells formed in a memory cell region including a first metal pad and a peripheral circuit formed in a peripheral circuit region including a second metal pad connected to the memory cell region by the first metal pad and the second metal pad, a plurality of word lines and a bit line connected to the memory cells, where each memory cell is connected to one of a plurality of word lines, the method comprising:
performing a first program operation by applying a first program voltage to a selected one of the word lines connected to a selected one of the memory cells to be programmed;
performing a first verify operation by sequentially applying a plurality of first verify voltages to the selected word line and applying a first word line voltage to at least one unselected word line not to be programmed among the plurality of word lines;
wherein the first word line voltage has a lower voltage level than a read voltage applied in a read operation of the nonvolatile memory device,
wherein the performing the first verify operation comprising:
applying the first word line voltage having a first level to a first adjacent word line located directly above the selected one of the word lines among the at least one unselected word line; and
applying the first word line voltage having the same first level to a second adjacent word line located directly below the selected one of the word lines among the at least one unselected word line.

13. The method of claim 12, further comprising:
performing a second program operation by applying a second program voltage to the selected word line; and
performing a second verify operation by sequentially applying a plurality of second verify voltages to the selected word line and applying a second word line voltage to the at least one unselected word line.

14. The method of claim 12, wherein the performing the first verify operation further comprising:
applying a second word line voltage to non-adjacent word line not adjacent to the selected one of the word lines among the at least one unselected word line, and wherein the first level of the first word line voltage is different than a level of the second word line voltage.

15. The method of claim 12, wherein the plurality of first verify voltages are different and have decreasing voltage levels.

16. The method of claim 12, the performing the first verify operation comprising:
applying a bit line voltage to the bit line, the bit line voltage higher than a bit line sensing voltage applied to the bit line in the read operation.

17. The method of claim 14, the first level of the first word line voltage is lower than the level of the second word line voltage.

* * * * *